(12) United States Patent
Campbell et al.

(10) Patent No.: US 8,351,206 B2
(45) Date of Patent: Jan. 8, 2013

(54) LIQUID-COOLED ELECTRONICS RACK WITH IMMERSION-COOLED ELECTRONIC SUBSYSTEMS AND VERTICALLY-MOUNTED, VAPOR-CONDENSING UNIT

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 12/825,745

(22) Filed: Jun. 29, 2010

(65) Prior Publication Data
US 2011/0315353 A1 Dec. 29, 2011

(51) Int. Cl.
*H05K 7/20* (2006.01)
(52) U.S. Cl. ........ 361/700; 361/691; 361/696; 361/702; 62/259.2
(58) Field of Classification Search .................. 361/691, 361/696–702
See application file for complete search history.

(56) References Cited

U.S. PATENT DOCUMENTS

| | | | |
|---|---|---|---|
| 2,125,888 A | 8/1938 | Cordrey |
| 2,512,545 A | 6/1950 | Hazard |
| 2,548,325 A | 4/1951 | Smith |
| 2,643,282 A | 6/1953 | Green |
| 2,791,888 A | 5/1957 | Vani |
| 3,109,485 A | 11/1963 | Fortier |
| 3,143,592 A | 8/1964 | August |
| 3,226,941 A | 1/1966 | Snelling |
| 3,404,730 A | 10/1968 | Kurisu |
| 3,476,175 A | 11/1969 | Plevyak |
| 3,512,582 A | 5/1970 | Chu et al. |
| 3,578,014 A | 5/1971 | Gachot |
| 3,586,101 A | 6/1971 | Chu et al. |

(Continued)

FOREIGN PATENT DOCUMENTS

DE 10112389 A1 10/2002

(Continued)

OTHER PUBLICATIONS

Office Action for U.S. Appl. No. 12/256,618 (U.S. Patent Publication No. 2010/0101759 A1), dated Aug. 30, 2010.

(Continued)

*Primary Examiner* — Courtney Smith
(74) *Attorney, Agent, or Firm* — Dennis Jung, Esq; Kevin P. Radigan, Esq.; Heslin Rothenberg Farley & Mesiti PC

(57) ABSTRACT

Liquid-cooled electronics racks are provided which include: immersion-cooled electronic subsystems; a vertically-oriented, vapor-condensing unit facilitating condensing dielectric fluid vapor egressing from the immersion-cooled subsystems, the vertically-oriented, vapor-condensing unit being sized and configured to reside adjacent to at least one side of the electronics rack; a reservoir for holding dielectric fluid, the reservoir receiving dielectric fluid condensate from the vertically-oriented, vapor-condensing unit; a dielectric fluid supply manifold coupling in fluid communication the reservoir and the dielectric fluid inlets of the immersion-cooled electronic subsystems; and a pump associated with a reservoir for pumping under pressure dielectric fluid from the reservoir to the dielectric fluid supply manifold for maintaining dielectric fluid in a liquid state within the immersion-cooled electronic subsystems.

17 Claims, 11 Drawing Sheets

U.S. PATENT DOCUMENTS

| | | |
|---|---|---|
| 3,600,636 A | 8/1971 | Petersen |
| 3,609,991 A | 10/1971 | Chu et al. |
| 3,774,677 A | 11/1973 | Antonetti et al. |
| 3,858,909 A | 1/1975 | Friedman |
| 4,064,300 A | 12/1977 | Bhangu |
| 4,108,242 A | 8/1978 | Searight et al. |
| 4,201,195 A | 5/1980 | Sakhuja |
| 4,302,793 A | 11/1981 | Rohner |
| 4,430,866 A | 2/1984 | Willitts |
| 4,590,538 A | 5/1986 | Cray, Jr. |
| 4,619,316 A | 10/1986 | Nakayama et al. |
| 4,622,946 A | 11/1986 | Hurley et al. |
| 4,649,990 A | 3/1987 | Kurihara et al. |
| 4,694,378 A | 9/1987 | Nakayama et al. |
| 4,704,658 A | 11/1987 | Yokouchi et al. |
| 4,741,385 A | 5/1988 | Bergles et al. |
| 4,750,086 A | 6/1988 | Mittal |
| 4,912,600 A | 3/1990 | Jaeger et al. |
| 4,928,206 A | 5/1990 | Porter et al. |
| 4,928,207 A | 5/1990 | Chrysler et al. |
| 4,962,444 A | 10/1990 | Niggemann |
| 5,021,924 A | 6/1991 | Kieda et al. |
| 5,057,968 A | 10/1991 | Morrison |
| 5,063,476 A | 11/1991 | Hamadah et al. |
| 5,067,047 A | 11/1991 | Azar |
| 5,126,919 A | 6/1992 | Yamamoto et al. |
| 5,168,348 A | 12/1992 | Chu et al. |
| 5,183,104 A | 2/1993 | Novotny |
| 5,220,804 A | 6/1993 | Tilton et al. |
| 5,270,572 A | 12/1993 | Nakajima et al. |
| 5,274,530 A | 12/1993 | Anderson |
| 5,297,621 A | 3/1994 | Taraci et al. |
| 5,305,184 A | 4/1994 | Anderesen et al. |
| 5,349,831 A | 9/1994 | Daikiku et al. |
| 5,390,077 A | 2/1995 | Paterson |
| 5,406,807 A | 4/1995 | Ashlwake et al. |
| 5,414,592 A | 5/1995 | Stout et al. |
| 5,458,185 A | 10/1995 | Mizuno |
| 5,467,250 A | 11/1995 | Howard et al. |
| 5,491,363 A | 2/1996 | Yoshikawa |
| 5,675,473 A | 10/1997 | McDunn et al. |
| 5,687,577 A | 11/1997 | Ballard et al. |
| 5,718,117 A | 2/1998 | McDunn et al. |
| 5,780,928 A | 7/1998 | Rostoker et al. |
| 5,782,101 A | 7/1998 | Dennis |
| 5,825,621 A | 10/1998 | Giannatto et al. |
| 5,829,264 A | 11/1998 | Ishigaki et al. |
| 5,854,092 A | 12/1998 | Root et al. |
| 5,860,602 A | 1/1999 | Tilton et al. |
| 5,864,466 A | 1/1999 | Remsburg |
| 5,880,931 A | 3/1999 | Tilton et al. |
| 5,907,473 A | 5/1999 | Przilas et al. |
| 5,943,211 A | 8/1999 | Havey et al. |
| 5,959,351 A | 9/1999 | Sasaki et al. |
| 5,963,425 A | 10/1999 | Chrysler et al. |
| 5,970,731 A | 10/1999 | Hare et al. |
| 6,000,908 A | 12/1999 | Bunker |
| 6,016,969 A | 1/2000 | Tilton et al. |
| 6,019,167 A | 2/2000 | Bishop et al. |
| 6,026,565 A | 2/2000 | Giannatto et al. |
| 6,052,284 A | 4/2000 | Suga et al. |
| 6,055,157 A | 4/2000 | Bartilson |
| 6,139,361 A | 10/2000 | Przilas et al. |
| 6,173,577 B1 | 1/2001 | Gold |
| 6,193,905 B1 | 2/2001 | Yamada et al. |
| 6,205,799 B1 | 3/2001 | Patel et al. |
| 6,212,895 B1 | 4/2001 | Richardson |
| 6,243,268 B1 | 6/2001 | Kang et al. |
| 6,320,744 B1 | 11/2001 | Sullivan et al. |
| 6,349,554 B2 | 2/2002 | Patel et al. |
| 6,366,462 B1 | 4/2002 | Chu et al. |
| 6,378,605 B1 | 4/2002 | Kutcher et al. |
| 6,392,891 B1 | 5/2002 | Tzlil et al. |
| 6,393,853 B1 | 5/2002 | Vukovic et al. |
| 6,404,640 B1 | 6/2002 | Ishimine et al. |
| 6,431,260 B1 | 8/2002 | Agonafer et al. |
| 6,457,321 B1 | 10/2002 | Patel et al. |
| 6,462,941 B1 | 10/2002 | Hulick et al. |
| 6,519,151 B2 | 2/2003 | Chu et al. |
| 6,536,510 B2 | 3/2003 | Khrustalev et al. |
| 6,571,569 B1 | 6/2003 | Rini et al. |
| 6,574,104 B2 | 6/2003 | Patel et al. |
| 6,581,388 B2 | 6/2003 | Novotny et al. |
| 6,616,469 B2 | 9/2003 | Goodwin et al. |
| 6,621,707 B2 | 9/2003 | Ishimine et al. |
| 6,644,058 B2 | 11/2003 | Bash et al. |
| 6,646,879 B2 | 11/2003 | Pautsch |
| 6,708,515 B2 | 3/2004 | Malone et al. |
| 6,807,056 B2 | 10/2004 | Kondo et al. |
| 6,817,196 B2 | 11/2004 | Malone et al. |
| 6,828,675 B2 | 12/2004 | Memory et al. |
| 6,927,980 B2 | 8/2005 | Fukuda et al. |
| 6,953,227 B2 | 10/2005 | Dunn et al. |
| 6,955,062 B2 | 10/2005 | Tilton et al. |
| 6,973,801 B1 | 12/2005 | Campbell et al. |
| 6,976,528 B1 | 12/2005 | Tilton et al. |
| 7,011,143 B2 | 3/2006 | Corrado et al. |
| 7,012,807 B2 | 3/2006 | Chu et al. |
| 7,057,893 B2 | 6/2006 | Nicolai et al. |
| 7,079,393 B2 | 7/2006 | Colgan et al. |
| 7,088,585 B2 | 8/2006 | Chu et al. |
| 7,104,078 B2 | 9/2006 | Tilton |
| 7,106,590 B2 | 9/2006 | Chu et al. |
| 7,134,289 B2 | 11/2006 | Patel et al. |
| 7,143,605 B2 | 12/2006 | Rohrer et al. |
| 7,187,549 B2 | 3/2007 | Teneketges |
| 7,191,954 B2 | 3/2007 | Kline |
| 7,222,502 B2 | 5/2007 | Kobayashi et al. |
| 7,233,491 B2 | 6/2007 | Faneuf et al. |
| 7,251,139 B2 | 7/2007 | Bhattacharya et al. |
| 7,252,100 B1 | 8/2007 | Downes et al. |
| 7,258,161 B2 | 8/2007 | Cosley et al. |
| 7,272,005 B2 | 9/2007 | Campbell et al. |
| 7,285,851 B1 | 10/2007 | Cepeda-Rizo et al. |
| 7,286,356 B2 | 10/2007 | Keenan et al. |
| 7,295,436 B2 | 11/2007 | Cheon |
| 7,295,440 B2 | 11/2007 | Ganev et al. |
| 7,309,209 B2 | 12/2007 | Amiot et al. |
| 7,349,213 B2 | 3/2008 | Campbell et al. |
| 7,355,852 B2 | 4/2008 | Pfahnl |
| 7,362,574 B2 | 4/2008 | Campbell et al. |
| 7,365,973 B2 | 4/2008 | Rasmussen et al. |
| 7,372,698 B1 | 5/2008 | Tilton et al. |
| 7,375,962 B2 | 5/2008 | Campbell et al. |
| 7,380,409 B2 | 6/2008 | Campbell et al. |
| 7,385,810 B2 | 6/2008 | Chu et al. |
| 7,392,660 B2 | 7/2008 | Tilton et al. |
| 7,392,823 B2 | 7/2008 | Dong et al. |
| 7,400,505 B2 | 7/2008 | Campbell et al. |
| 7,403,392 B2 | 7/2008 | Attlesey et al. |
| 7,408,776 B2 | 8/2008 | Campbell et al. |
| 7,414,845 B2 | 8/2008 | Attlesey et al. |
| 7,420,808 B2 | 9/2008 | Campbell et al. |
| 7,428,151 B2 | 9/2008 | Sonnabend et al. |
| 7,436,666 B1 | 10/2008 | Konshak |
| 7,450,384 B2 | 11/2008 | Tavassoli et al. |
| 7,450,385 B1 * | 11/2008 | Campbell et al. ............. 361/699 |
| 7,466,549 B2 | 12/2008 | Dorrich et al. |
| 7,477,513 B1 | 1/2009 | Cader et al. |
| 7,477,514 B2 | 1/2009 | Campbell et al. |
| 7,495,914 B2 | 2/2009 | Tilton et al. |
| 7,531,142 B2 | 5/2009 | Huziwara et al. |
| 7,559,207 B2 | 7/2009 | Knight et al. |
| 7,561,425 B2 | 7/2009 | Mindock et al. |
| 7,602,608 B2 | 10/2009 | Tilton et al. |
| 7,609,518 B2 | 10/2009 | Hopton et al. |
| 7,630,795 B2 | 12/2009 | Campbell et al. |
| 7,639,499 B1 | 12/2009 | Campbell et al. |
| 7,641,101 B2 | 1/2010 | Campbell et al. |
| 7,654,100 B2 | 2/2010 | Rini et al. |
| 7,660,109 B2 | 2/2010 | Iyengar et al. |
| 7,661,463 B2 | 2/2010 | Liu |
| 7,724,524 B1 | 5/2010 | Campbell et al. |
| 7,885,070 B2 | 2/2011 | Campbell et al. |
| 7,916,483 B2 | 3/2011 | Campbell et al. |
| 7,944,694 B2 | 5/2011 | Campbell et al. |
| 7,957,145 B2 | 6/2011 | Suzuki et al. |

| | | | |
|---|---|---|---|
| 7,961,475 | B2 | 6/2011 | Campbell et al. |
| 7,983,040 | B2* | 7/2011 | Campbell et al. ............. 361/699 |
| 8,014,150 | B2* | 9/2011 | Campbell et al. ............. 361/700 |
| 8,077,462 | B2* | 12/2011 | Barringer et al. ............. 361/700 |
| 2002/0062945 | A1 | 5/2002 | Hocker et al. |
| 2003/0230401 | A1 | 12/2003 | Pfister et al. |
| 2004/0008490 | A1 | 1/2004 | Cheon |
| 2004/0057211 | A1 | 3/2004 | Kondo et al. |
| 2005/0083655 | A1 | 4/2005 | Jairazbhoy et al. |
| 2005/0207116 | A1 | 9/2005 | Yatskov et al. |
| 2005/0241802 | A1 | 11/2005 | Malone et al. |
| 2005/0244280 | A1 | 11/2005 | Malone et al. |
| 2005/0254214 | A1 | 11/2005 | Salmon |
| 2006/0026983 | A1* | 2/2006 | Tilton et al. ..................... 62/310 |
| 2006/0126296 | A1 | 6/2006 | Campbell et al. |
| 2006/0162365 | A1 | 7/2006 | Hoang et al. |
| 2006/0180300 | A1 | 8/2006 | Lenehan et al. |
| 2007/0025081 | A1 | 2/2007 | Berlin et al. |
| 2007/0035937 | A1 | 2/2007 | Colbert et al. |
| 2007/0121295 | A1 | 5/2007 | Campbell et al. |
| 2007/0159797 | A1 | 7/2007 | Teneketges |
| 2007/0183125 | A1* | 8/2007 | Tilton et al. ................... 361/699 |
| 2007/0193300 | A1 | 8/2007 | Tilton et al. |
| 2007/0199204 | A1 | 8/2007 | Knight et al. |
| 2007/0199340 | A1 | 8/2007 | Knight et al. |
| 2007/0201210 | A1 | 8/2007 | Chow et al. |
| 2007/0227710 | A1 | 10/2007 | Belady et al. |
| 2007/0291452 | A1 | 12/2007 | Gilliland et al. |
| 2007/0295480 | A1 | 12/2007 | Campbell et al. |
| 2007/0297136 | A1 | 12/2007 | Konshak |
| 2008/0002363 | A1 | 1/2008 | Campbell et al. |
| 2008/0018212 | A1 | 1/2008 | Spearing et al. |
| 2008/0024991 | A1 | 1/2008 | Colbert et al. |
| 2008/0062639 | A1 | 3/2008 | Campbell et al. |
| 2008/0123297 | A1 | 5/2008 | Tilton et al. |
| 2008/0158818 | A1 | 7/2008 | Clidaras et al. |
| 2008/0196868 | A1 | 8/2008 | Attlesey et al. |
| 2008/0209931 | A1 | 9/2008 | Stevens |
| 2008/0225478 | A1 | 9/2008 | Goettert et al. |
| 2009/0080173 | A1 | 3/2009 | Porter et al. |
| 2009/0086428 | A1 | 4/2009 | Campbell et al. |
| 2009/0086432 | A1 | 4/2009 | Campbell et al. |
| 2009/0126909 | A1* | 5/2009 | Ellsworth et al. ........ 165/104.33 |
| 2009/0126910 | A1 | 5/2009 | Campbell et al. |
| 2009/0133866 | A1 | 5/2009 | Campbell et al. |
| 2009/0238235 | A1 | 9/2009 | Campbell et al. |
| 2009/0260777 | A1 | 10/2009 | Attlesey |
| 2009/0268404 | A1 | 10/2009 | Chu et al. |
| 2009/0314467 | A1 | 12/2009 | Campbell et al. |
| 2009/0316360 | A1 | 12/2009 | Campbell et al. |
| 2010/0101759 | A1 | 4/2010 | Campbell et al. |
| 2010/0101765 | A1 | 4/2010 | Campbell et al. |
| 2010/0103614 | A1 | 4/2010 | Campbell et al. |
| 2010/0103618 | A1 | 4/2010 | Campbell et al. |
| 2010/0103620 | A1 | 4/2010 | Campbell et al. |
| 2010/0246118 | A1 | 9/2010 | Attlesey |
| 2010/0326628 | A1* | 12/2010 | Campbell et al. ........ 165/104.21 |
| 2011/0315344 | A1* | 12/2011 | Campbell et al. ............. 165/80.4 |

FOREIGN PATENT DOCUMENTS

| | | |
|---|---|---|
| JP | 8-254512 A | 10/1996 |
| JP | 2002-374086 | 12/2002 |
| WO | 2009131810 | 10/2009 |

OTHER PUBLICATIONS

Office Action for U.S. Appl. No. 12/256,623 (U.S. Patent Publication No. 2010/0101765 Al), dated Nov. 5, 2010.

Notice of Allowance for U.S. Appl. No. 12/256,618 (U.S. Publication No. 2010/0101759 A1), dated Feb. 10, 2011.

Campbell et al., Notice of Allowance for U.S. Appl. No. 12/825,756, filed Jun. 29, 2010 (U.S. Patent Publication No. 2011/0315355 A1), dated Jan. 13, 2012.

Campbell et al., Notice of Allowance for U.S. Appl. No. 12/825,781, filed Jun. 29, 2010 (U.S. Patent Publication No. 2011/0317367 A1), dated Jan. 20, 2012.

Campbell et al., Notice of Allowance for U.S. Appl. No. 12/985,552, filed Jan. 6, 2011 (U.S. Patent Publication No. 2011/0103019 A1), dated Feb. 16, 2012.

RD 323064, RD, A, Mar. 10, 1991.

Office Action for U.S. Appl. No. 12/256,631 (U.S. Patent Publication No. 2010-0103614 A1 ), dated Apr. 21, 2010.

Office Action for U.S. Appl. No. 12/256,628 (U.S. Patent Publication No. 2010-0103618 A1), dated Aug. 5, 2010.

Office Action for U.S. Appl. No. 12/256,605 (U.S. Patent Publication No. 2010/0103620 A1), dated Aug. 10, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Hwang, U., "Heat Exchanger for Vapor Condensation by Dropwise Technique", IBM Technical Disclosure Bulletin, Publication No. IPCOM000089717D (Dec. 1, 1977).

Chu et al.,"Dielectric Fluidized Cooling System", IBM Technical Disclosure Bulletin, Publication No. IPCOM000088682D (Jul. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Campbell et al., "Suspended Integrated Manifold System with Serviceability for large Planar Arrays of Electronic Modules", IBM Technical Disclosure, Publication No. IPCOM000126455D (Jul. 18, 2005).

International Application No. PCT/EP2009/060792, filed Aug. 20, 2009. Notification of International Search Report, dated Dec. 23, 2009.

Chee, B., "Supermicro Water Cooled Blades", Info World, Geeks in Paradise, (Mar. 5, 2008), http://weblog.infoworld.com/geeks/archives/2008/03.

D. Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed Jun. 25, 2009.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Adjusting Coolant Flow Resistance Through Liquid-Cooled Electronics Rack(s)", U.S. Appl. No. 12/556,040, filed Sep. 9, 2009.

Campbell et al., "Apparatus and Method with Forced Coolant Vapor Movement for Facilitating Two-Phase Cooling of an Electric Device", U.S. Appl. No. 12/565,175, filed Sep. 23, 2009.

Campbell et al., "Liquid-Cooled Electronics Apparatus and Methods of Fabrication", U.S. Appl. No. 12/556,081, filed Sep. 24, 2009.

Campbell et al., "Compliant Conduction Rail Assembly and Method Facilitating Cooling of an Electronics Structure", U.S. Appl. No. 12/570,215, filed Sep. 30, 2009.

Campbell et al., "Cooled Electronic Module with Pump-Enhanced, Dielectric Fluid Immersion-Cooling", U.S. Appl. No. 12/491,281, filed Jun. 25, 2009.

Campbell et al., "System and Method for Standby Mode Cooling of a Liquid-Cooled Electronics Rack", U.S. Appl. No. 12/567,954, filed Sep. 28, 2009.

Campbell et al., "Cooling System and Method Minimizing Power Consumption in Cooling Liquid-Cooled Electronics Racks", U.S. Appl. No. 12/556,066, filed Sep. 9, 2009.

* cited by examiner

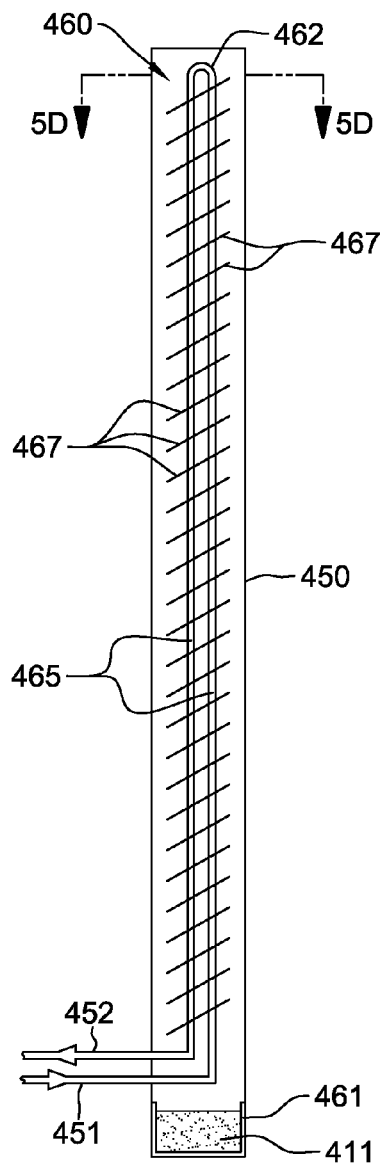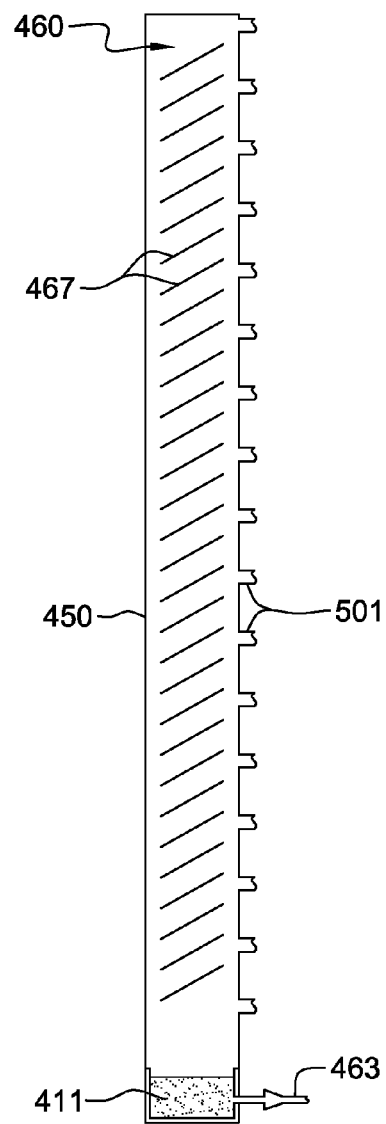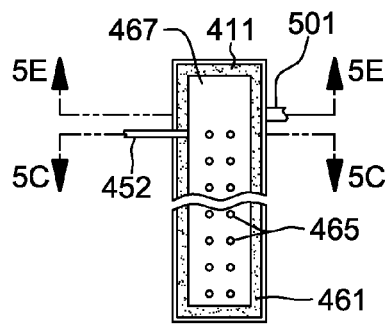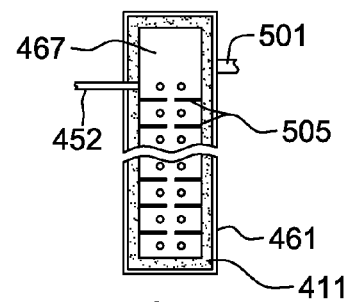
FIG. 5C
FIG. 5D
FIG. 5E
FIG. 5F

LIQUID-COOLED ELECTRONICS RACK WITH IMMERSION-COOLED ELECTRONIC SUBSYSTEMS AND VERTICALLY-MOUNTED, VAPOR-CONDENSING UNIT

BACKGROUND

The present invention relates in general to apparatuses and methods for facilitating cooling of rack-mounted assemblages of individual electronic units, such as rack-mounted computer server units.

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the availability of the room air-conditioning to effectively handle the load. This is especially true for large installations with "server farms" or large banks of computer racks close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

The shortcomings of the prior art are overcome and additional advantages are provided through the provision of a liquid-cooled electronics rack comprising an electronics rack including a plurality of immersion-cooled electronic subsystems, each immersion-cooled electronic subsystem including: a housing at least partially surrounding and forming a compartment about the electronic subsystem, the electronic subsystem comprising a plurality of electronic components to be cooled; a dielectric fluid disposed within the compartment, wherein the plurality of electronic components to be cooled are at least partially immersed within the dielectric fluid; and a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet. The liquid-cooled electronics rack further includes: a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent at least one side of the electronics rack; a reservoir for holding dielectric fluid, the reservoir receiving dielectric fluid condensate from the vertically-oriented, vapor-condensing unit; a dielectric fluid supply manifold coupling in fluid communication the reservoir and the dielectric fluid inlets of the plurality of immersion-cooled electronic subsystems; and a pump associated with the reservoir for pumping under pressure dielectric fluid from the reservoir to the dielectric fluid supply manifold for maintaining dielectric fluid in a liquid state within the compartments of the plurality of immersion-cooled electronic subsystems.

In another aspect, a liquid-cooled electronics rack is provided which comprises an electronics rack including a plurality of immersion-cooled electronic subsystems, each immersion-cooled electronic subsystem comprising: a housing at least partially surrounding and forming a compartment about the electronic subsystem, the electronic subsystem comprising a plurality of electronic components to be cooled; a dielectric fluid disposed within the compartment, wherein the plurality of electronic components to be cooled are at least partially immersed within the dielectric fluid; and a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet. The liquid-cooled electronics rack further includes: a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent to at least one side of the electronics rack; a reservoir for holding dielectric fluid, the reservoir receiving dielectric fluid condensate from the vertically-oriented, vapor-condensing unit; a dielectric fluid supply manifold coupling in fluid communication the reservoir and the dielectric fluid inlets of the plurality of immersion-cooled electronic subsystems; a pump associated with the reservoir for pumping under pressure dielectric fluid from the reservoir to the dielectric fluid supply manifold for maintaining dielectric fluid in a liquid state within the compartments of the plurality of immersion-cooled electronic subsystems; and multiple flow restrictors associated with multiple immersion-cooled electronic subsystems of the plurality of immersion-cooled electronic subsystems, each flow restrictor of the multiple flow restrictors being associated with a respective immersion-cooled electronic subsystem of the multiple immersion-cooled electronic subsystems and being disposed in fluid communication with the dielectric fluid inlet to the compartment thereof, and wherein the multiple flow restrictors facilitate balancing dielectric fluid flow from the dielectric fluid supply manifold to the multiple immersion-cooled electronic subsystems of the liquid-cooled electronics rack.

In a further aspect, a method of facilitating cooling of an electronics rack is provided. The method includes: providing the electronics rack with a plurality of immersion-cooled electronic subsystems, each immersion-cooled electronic subsystem comprising: a housing at least partially surrounding and forming a compartment about the electronic subsystem, the electronic subsystem comprising a plurality of electronic components to be cooled; a dielectric fluid disposed within the compartment, wherein the plurality of electronic components to be cooled are at least partially immersed within the dielectric fluid; and a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet. The method further includes: providing a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent to at least one side of the electronics rack; providing a reservoir for holding dielectric fluid, the reservoir receiving dielectric fluid condensate from the vertically-oriented, vapor-condensing unit; providing a dielectric fluid supply manifold coupling in fluid communication the reservoir and the dielectric fluid inlets of the plurality of immersion-cooled electronic subsystems; and providing a pump associated with the reservoir for pumping under pressure dielectric fluid from the reservoir to the dielectric fluid supply manifold for maintaining dielectric fluid in a liquid state within the compartments of the plurality of immersion-cooled electronic subsystems.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5C is a cross-sectional elevational view of the door and vertically-oriented, vapor-condensing unit embodiment of FIG. 5A, taken long line 5C-5C in the cross-sectional plan view thereof of FIG. 5D, in accordance with an aspect of the present invention;

FIG. 5D is a cross-sectional plan view of the door and vertically-oriented, vapor-condensing unit embodiment of FIG. 5C, taken along line 5D-5D thereof, in accordance with an aspect of the present invention;

FIG. 5E is a cross-sectional elevational view of the door and vertically-oriented, vapor-condensing unit embodiment of FIG. 5D, taken along line 5E-5E thereof, in accordance with an aspect of the present invention;

FIG. 5F is a cross-sectional plan view of an alternate embodiment of a door and vertically-oriented, vapor-condensing unit, in accordance with an aspect of the present invention;

DETAILED DESCRIPTION

Figure 1:
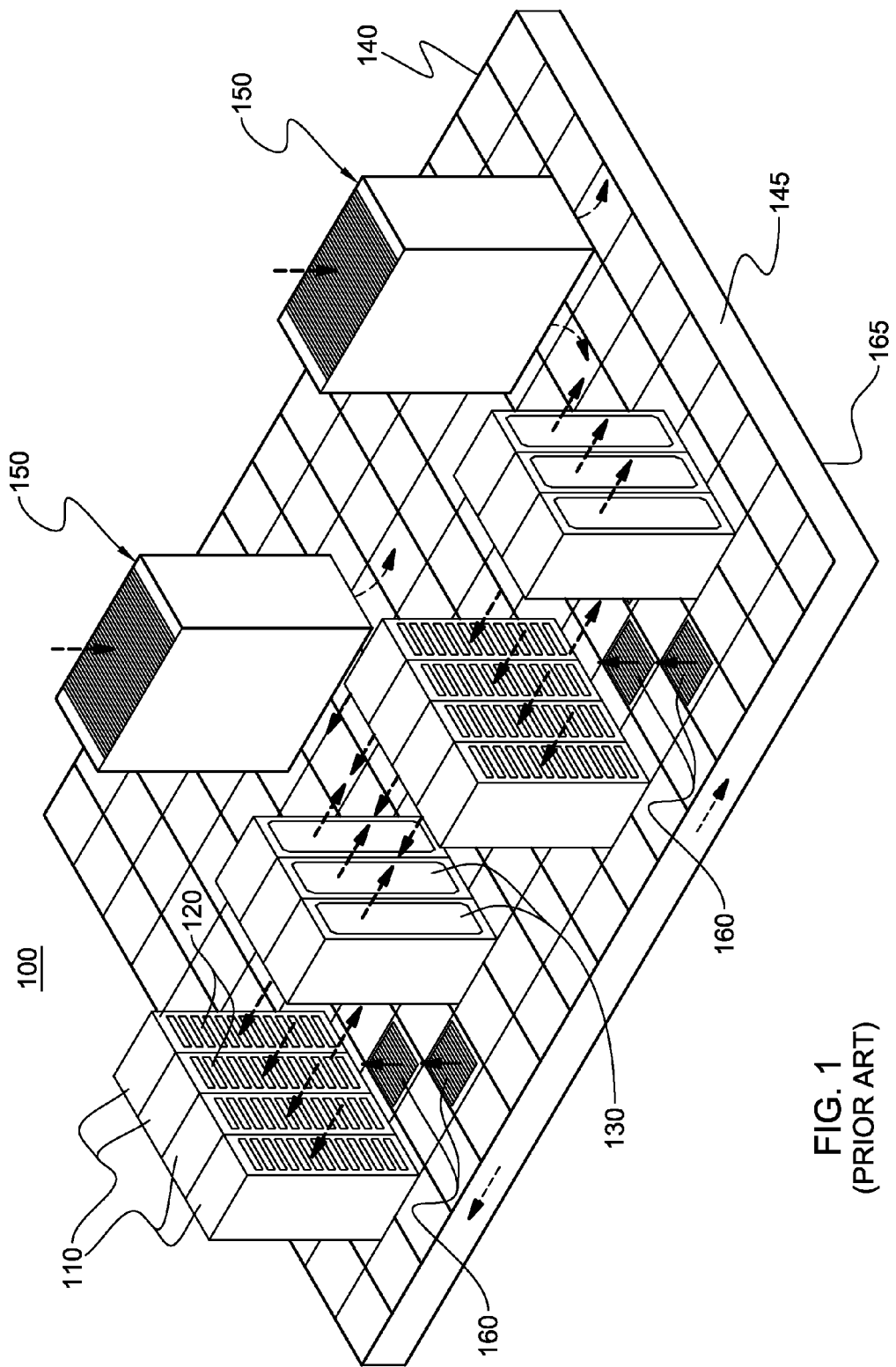
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise one or more electronic subsystems, each having one or more heat generating components disposed therein requiring cooling. "Electronic subsystem" refers to any housing, blade, book, drawer, node, compartment, board, etc., having multiple heat generating electronic components disposed therein or thereon. Each electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "data center" refers to a computer installation containing one or more electronics racks to be cooled. As a specific example, a data center may include one or more rows of rack-mounted computing units, such as server units.

An electronic system chassis may be a multi-blade center system. The blades of each multi-blade center system may be removable, and comprise multiple components to be liquid-cooled. In one example, one or more blades of a multi-blade center system are immersion-cooled blades. "Immersion-cooled blades" refers to any blade, book, node, etc. having multiple components thereof cooled by immersion within coolant disposed within the blade. One detailed example of an immersion-cooled blade is described in commonly assigned U.S. Patent Publication No. 2010/0101759 A1, published Apr. 29, 2010, and entitled "Apparatus and Method for Facilitating Immersion-Cooling of an Electronic Subsystem". Multiple components of an immersion-cooled blade may be directly immersion-cooled by the coolant or indirectly immersion-cooled. Indirect immersion cooling refers to the existence of a thermal cap, thermal spreader, passivation layer, or other surface interposed between a surface of the component and the coolant within which the component is immersed.

As used herein, "heat exchanger" refers to any heat exchange assembly through which a first coolant and a second coolant can circulate. In the embodiments described herein, the first coolant is a liquid coolant, and the second coolant is a two-phase dielectric coolant which condenses within the heat exchanger. The heat exchanger comprises a facility coolant path and a plurality of thermally conductive fins extend into a second coolant path comprising the two-phase dielectric coolant. Size, configuration and construction of the heat exchanger can vary without departing from the scope of the present invention.

One example of facility coolant flowing through the first coolant path is water, and examples of the two-phase dielectric coolant flowing through the second coolant path comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to use of other first coolants and second coolants. For example, the first coolant may alternately comprise a brine, a liquid metal, or similar coolant, or a refrigerant, while still maintaining various advantages and unique features of the present invention.

Reference is made below to the drawings (which are not drawn to scale and which are simplified for ease of understanding), wherein the same reference numbers used throughout different figures designate the same or similar components.

As shown in FIG. 1, in a raised floor layout of an air-cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, which in on embodiment, are also disposed within the computer installation 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2A:
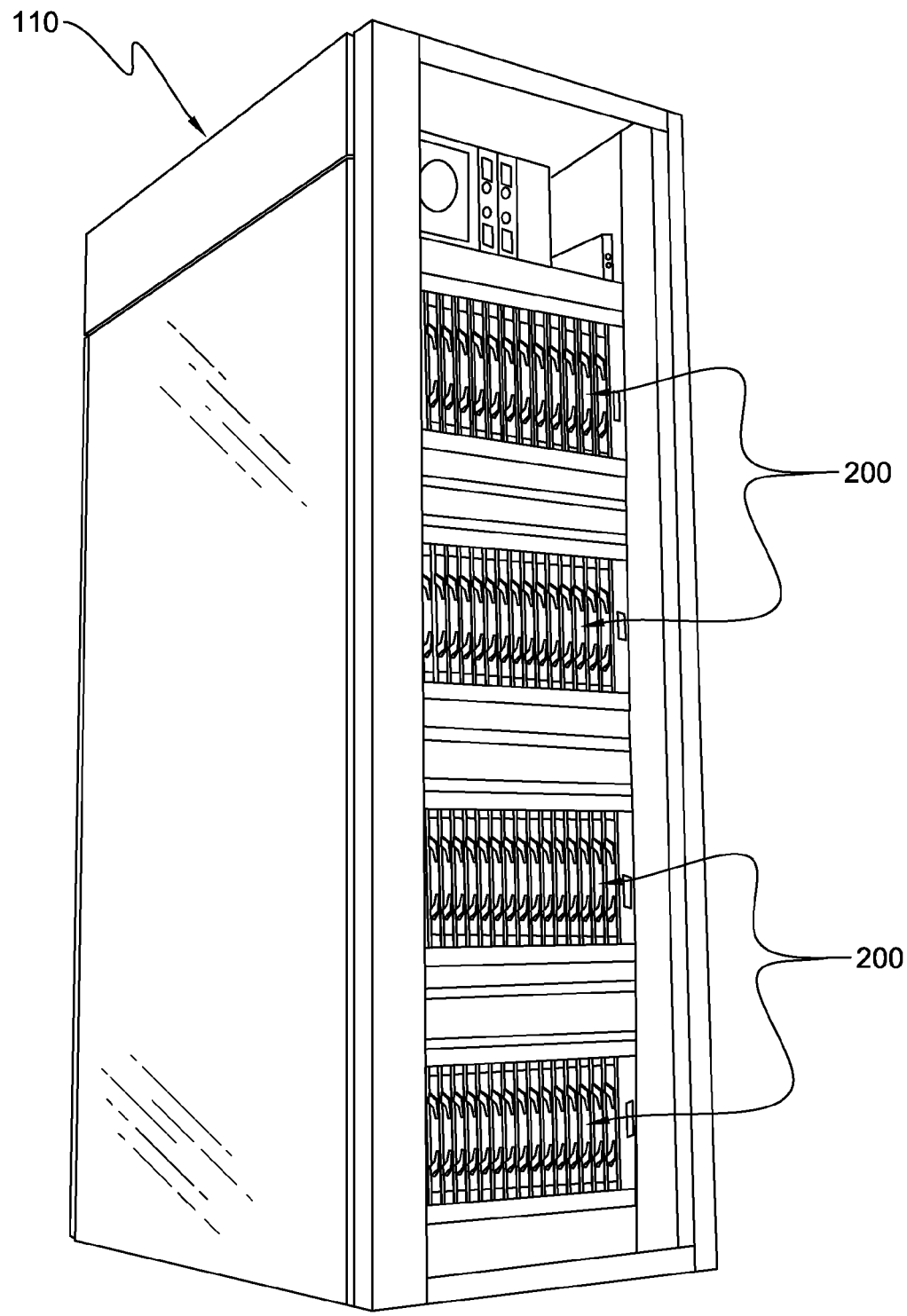
FIG. 2A depicts one embodiment of an electronics rack with a stack of multiple-blade center systems to receive liquid coolant, in accordance with one aspect of the present invention.

FIG. 2A depicts one embodiment of an electronics rack 110 comprising a stack of electronic system chassis or multi-blade center systems 200, as well as supporting power supplies, networking equipment, etc.

Figure 2B:
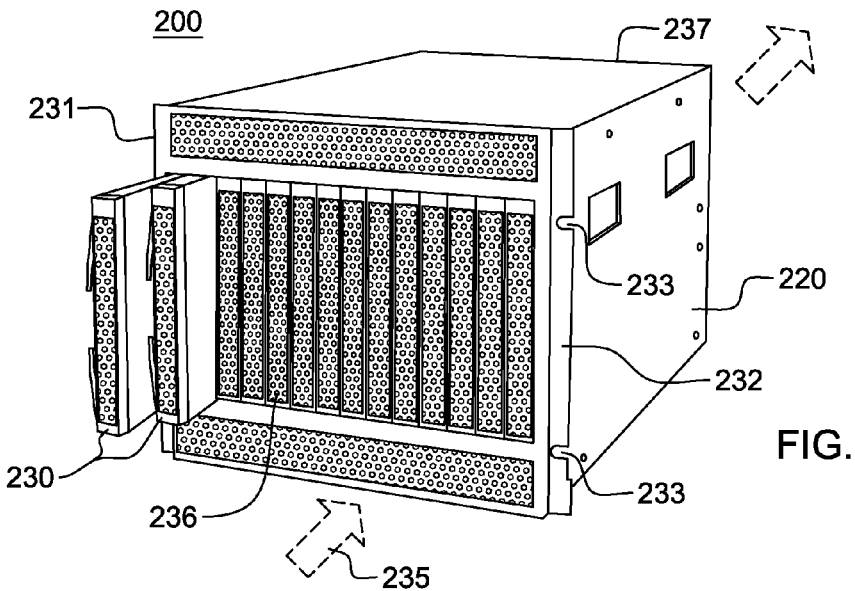
FIG. 2B is an isometric view of one embodiment of one multi-blade center system of the electronics rack of FIG. 2A.

FIG. 2B illustrates one embodiment of multi-blade center system 200, one example of which is marketed by International Business Machines Corporation, of Armonk, N.Y. By way of specific example, multi-blade center system 200 may comprise a stand alone server system which incorporates scalable computing functionality up to, for example, fourteen high performance servers (or blades).

As shown in FIG. 2B, multi-blade center system 200 includes a system chassis 220 and multiple removable blades 230. As one example, each removable blade 230 is an electronics subsystem, such as a server of a multi-server electronics system. A first flange 231 and second flange 232 with openings 233 are also illustrated. Typically, flanges 231, 232 are used to secure the multi-blade center system within an electronics rack, such as depicted in FIG. 2A. Airflow 235 is conventionally provided through an air inlet side 136 of multi-blade center system 210 to an air outlet side 237, and is typically established, for example, by two or more air-moving devices (not shown) disposed at the back portion of the system housing. Electrical and networking infrastructure is also located near the back of system chassis 220.

Figure 2C:
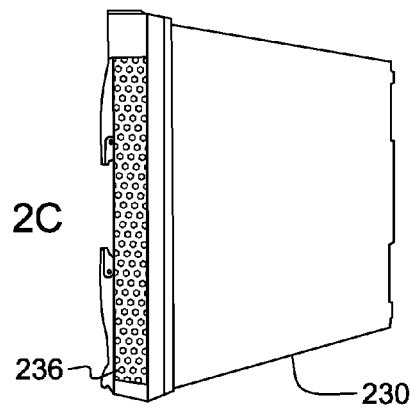
FIG. 2C is an isometric view of one embodiment of an individual removable blade of a multi-blade center system of FIG. 2B.
Figure 2D:
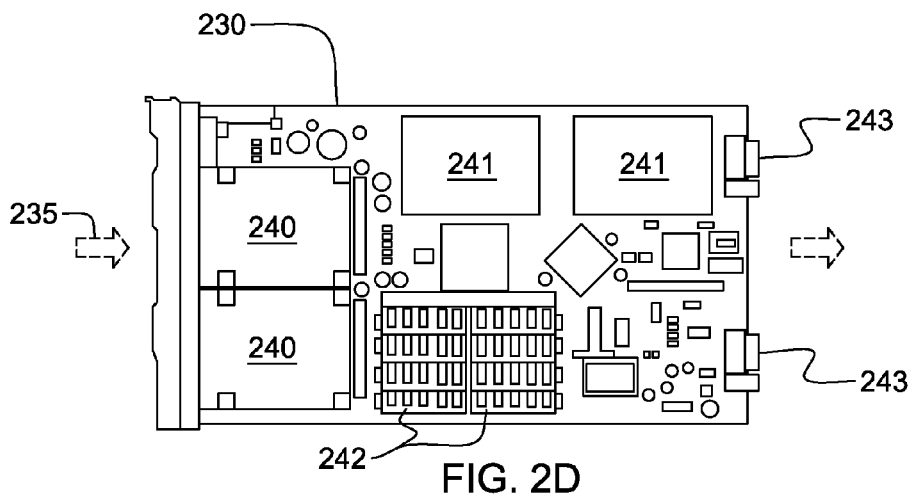
FIG. 2D is a side elevational view of one embodiment of the removable blade of FIG. 2C.

FIGS. 2C & 2D depict one embodiment of a removable blade 230 of the electronic system chassis. As illustrated in FIG. 2D, removable blade 230 includes, for example, multiple processors above which conventionally reside respective air-cooled heat sinks 240. In this example, each removable blade is a complete computer system, or subsystem, and includes, for example, Direct Access Storage Device (DASD) 241 and Dual In-Line Memory Modules (DIMMs) 242. Electrical connectors 243 are provided for electrically connecting blade 230 to the respective electronic system chassis 220 (FIG. 2B). Corresponding electrical connectors are disposed within the electronic system chassis near the back thereof for making electrical connection to connectors 243 when the blade is inserted into the chassis in operational position.

By way of specific example, a typical blade center chassis today is 9U tall (where 1U equals 1.75 inches or 44.45 mm) and houses 14 field-replaceable blades, each containing two central processing units (CPUs). A standard electronics rack that is 42U tall can thus accommodate four such blade center chassis (each 9U tall), for a total of 56 blades and 112 CPU modules. International Business Machines Corporation markets three versions of a blade center chassis, namely, the BC, BCH and BC-Telco versions. FIGS. 2A-2D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple components to be immersion-cooled.

Advantageously, liquid cooling of a multi-blade center system, or an electronics rack such as depicted in FIG. 2A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack are eliminated, thereby reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place.

Disclosed hereinbelow (in one aspect) is a liquid cooling apparatus which achieves 100% liquid cooling of, for example, the blades of a multi-blade center system, whether as a stand alone system, or stacked within an electronics rack with other multi-blade center systems.

Figure 3:
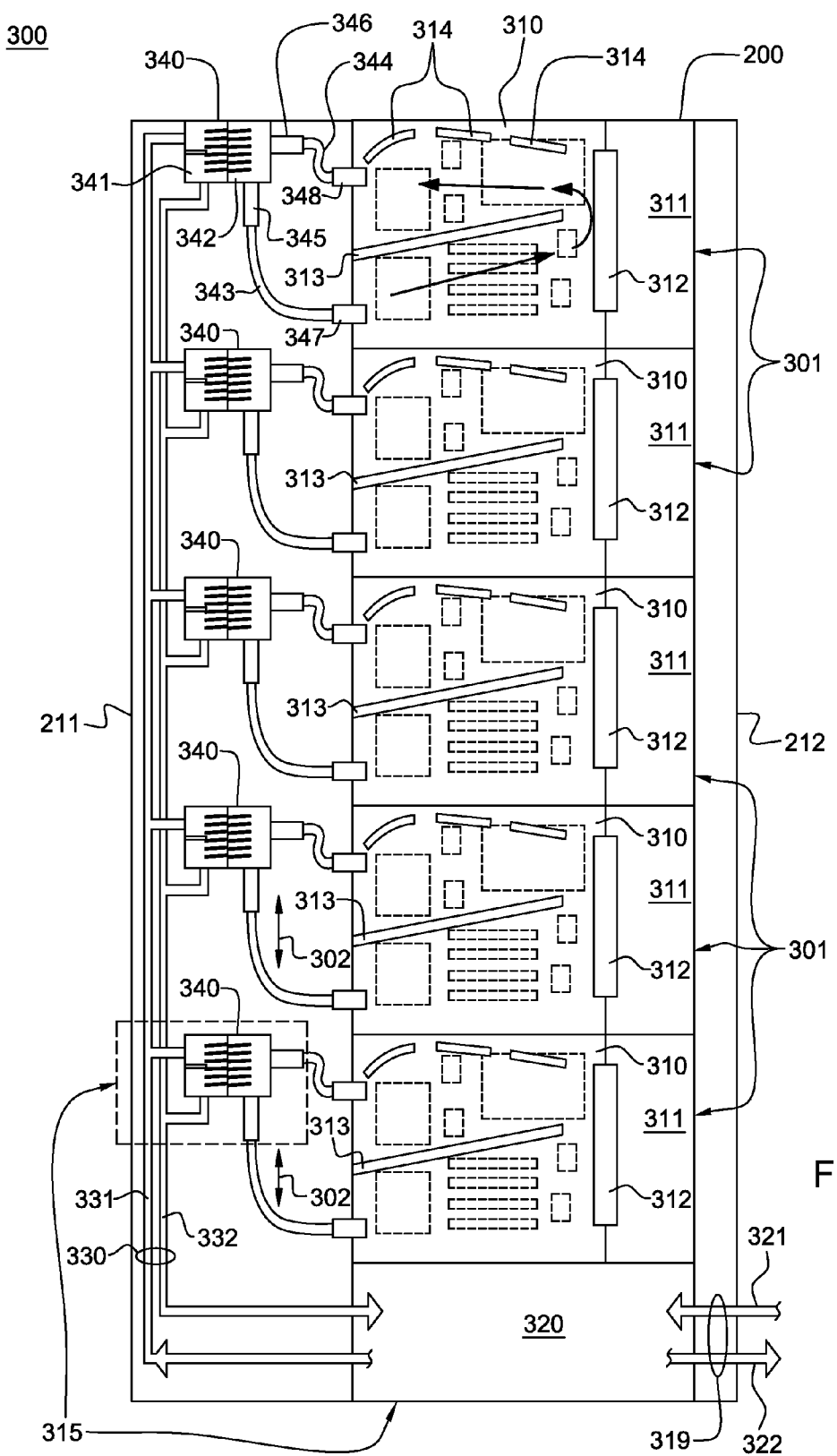
FIG. 3 is a schematic of one embodiment of a liquid-cooled electronics rack comprising (in the illustrated embodiment) a stack of multi-blade center systems and a liquid cooling apparatus, in accordance with an aspect of the present invention.

FIG. 3 is a schematic of one embodiment of a liquid-cooled electronics rack, generally denoted 300, in accordance with an aspect of the present invention. Liquid-cooled electronics rack 300 includes an electronics rack 200 having a plurality of multi-blade center systems 301 stacked within the rack. In this example, five multi-blade center systems 301 are illustrated, with each system being an example of an electronic system chassis. As illustrated in FIG. 3, each multi-blade center system 301 includes a back plane 312, into which respective removable blades 310 are electrically inserted, and a back space 311 which conventionally accommodates one or more air-moving devices (not shown) to cause airflow to flow from a front side 211 to a back side 212 of electronics rack 300 through the multi-blade center system 301.

One embodiment of a liquid cooling apparatus, generally denoted 315, is illustrated in FIG. 3. In this embodiment, a liquid cooling unit 320 is disposed in a lower portion of electronics rack 200. Liquid cooling unit 320 includes, for example, a liquid-to-liquid heat exchanger (not shown) for extracting heat from coolant flowing through a first coolant loop 330 of liquid cooling apparatus 315 and dissipating heat within a facility coolant loop 319 comprising a facility coolant supply line 321 and facility coolant return line 322. In one example, facility coolant supply line 321 and facility coolant return line 322 couple liquid cooling unit 320 to a data center facility coolant supply and return (not shown). Liquid cooling unit 320 further includes an appropriately sized reservoir, pump, and optional filter, for moving liquid coolant through first coolant loop 330. In one embodiment, first coolant loop 330 includes a rack-level inlet manifold 331 and a rack-level outlet manifold 332, which are coupled to liquid cooling unit 320 via, for example, flexible hoses and respective quick connect couplings. The flexible hoses allow the rack-level manifolds to be mounted within, for example, a door of the electronics rack hingedly mounted to the air inlet side of the electronics rack. In one example, rack-level inlet manifold 331 and rack-level outlet manifold 332 each comprise an elongated, rigid tube vertically mounted to electronics rack 200.

In the embodiment illustrated, the rack-level coolant manifold assembly, comprising rack-level inlet manifold 331 and rack-level outlet manifold 332 is in fluid communication with multiple movable chassis-level manifold subassemblies 340. As illustrated in FIG. 3, each movable chassis-level manifold assembly is coupled to the electronics rack to reciprocate vertically (as indicated by arrows 302) adjacent to an associated electronic system chassis to facilitate the removal of individual blades, without impacting cooling of adjacent blades. Respective quick connect couplings may be employed to coupled the rack-level inlet manifold and rack-level outlet manifold to each movable chassis-level manifold assembly 340, using for example appropriately sized, flexible rack-level tubing. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 340 includes a first chamber 341 and a plurality of second chambers 342 disposed, in this example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transferred to coolant passing through the first coolant path of each chassis-level manifold assembly is transferred via the rack-level outlet manifold 332 and liquid cooling unit 320 to facility coolant loop 319. In one example, coolant passing through first coolant loop 330, and hence, coolant passing through the first coolant paths within the movable chassis-level manifold assemblies, is water. In the example illustrated, the vertically oriented rack-level inlet and outlet manifolds each have five ports, which connect to five horizontally oriented, movable chassis-level manifold assemblies 340. The chassis-level manifold assemblies serve as a heat rejection component for the heat load removed from the individual blades 310 of the respective multi-blade center systems 301.

Each second chamber of the plurality of second chambers of each chassis-level manifold assembly 340 has an outlet coupled via flexible tubing 343 to a coolant inlet of a respective immersion-cooled blade 310. In one embodiment, each flexible tubing 343 couples to a respective second chamber of the chassis-level manifold assembly 340 via an appropriate hose barb fitting 345, and couples to the immersion-cooled blade 310 via a quick connect coupling 347. Further, flexible tubing 344 couples an inlet of each second chamber of the plurality of second chambers of each chassis-level manifold assembly 340 to a coolant outlet of the respective immersion-cooled blade 310. At the outlet, a quick connect coupling 348 may again be employed to facilitate connection or disconnection of the corresponding immersion-cooled blade, while at the other end, flexible tubing 344 couples to chassis-level manifold assembly 340 via an appropriate hose barb fitting 346. Flexible tubes 343, 344 are sized and provided with sufficient flexibility to allow the associated movable chassis-level manifold assembly 340 to reciprocate within a designed extent of travel, as illustrated by arrows 302.

As noted, in one example, a two-phase dielectric coolant is employed within immersion-cooled blade 310 and the second chambers of the respective chassis-level manifold assemblies 340. In operation, upper flexible tubing 344 transports vaporized coolant from the immersion-cooled blade 310 to the corresponding second chamber of the chassis-level manifold assembly. This second chamber functions as a condenser, with the lower flexible tubing 343 transporting condensed liquid coolant from the second chamber to the immersion-cooled blade 310 for continued cooling of the immersion-cooled blade. Electronic components within the blade may be exposed either directly or indirectly to the dielectric coolant, and heat transfer takes place via, for example, boiling at one or more surfaces of the heat-producing components. The liquid coolant, and resultant vapor, are directed via one or more baffles 313 to an upper portion of the blade 310, where the vapor rises to the top portion of the blade, and is directed via one or more vapor deflectors 314 back into the second chamber for condensing. Flow of vapor back to the second chamber is facilitated by the liquid-vapor pressure differential between the upper portion of the blade and the corresponding second chamber functioning as the condenser region. Both the first chamber and the plurality of second chambers of the chassis-level manifold assembly have thermally conductive fin structures extending therein from the heat exchanger to enhance heat transfer. These fin structures may comprise pin fin type thermally conductive elements, or plate type thermally conductive elements. The coolant flowing through the first chamber of each chassis-level manifold assembly yields a temperature at the condenser fins in the respective second chambers of the manifold assembly that is well below the boiling point of the dielectric coolant employed in the immersion-cooled blade. As a result, the vapor-condenses over the surfaces of these fins. The condensed liquid may be close in temperature to the vapor, or it could be sub-cooled to a much lower temperature, based on operating conditions on the first coolant loop side of the manifold assembly's heat exchanger.

As a further cooling approach to the above-described liquid-cooled electronics rack, direct immersion-cooling of electronic components of a plurality of horizontally-disposed electronic subsystems within an electronics rack may be employed. Such an immersion-cooling approach also advantageously avoids forced air-cooling and enables total liquid-cooling of the electronics rack within a data center. Where employable, the use of dielectric fluid immersion-cooling may offer several unique benefits over air-cooling or a hybrid air and water cooling approach.

For example, the use of a dielectric fluid that condenses at a temperature above typical outdoor ambient air temperature enables data center cooling architectures which do not require energy-intensive refrigeration chillers. Yet other practical advantages, such as the ability to ship a coolant-filled electronic subsystem, may offer benefit over a water-cooled approach, which typically would require shipping dry and the use of a fill and drain protocol to insure against freeze damage during transport. Also, the use of liquid immersion-cooling may, in certain cases, allow for greater compaction of electronic components at the electronic subsystem level and/or the electronic rack level, since conductive cooling structures may be eliminated. Unlike corrosion-sensitive water-cooled systems, chemically inert dielectric coolant can be employed within an immersion-cooling approach such as described herein, which would not mandate copper as the primary thermally conductive wetted metal. Lower cost and lower mass aluminum structures could replace copper structures wherever thermally viable, and the mixed, wetted metal assemblies would not be vulnerable to galvanic corrosion, such as in a water-based cooling approach. For at least these potential benefits, dielectric fluid immersion-cooling of one or more electronic subsystems of an electronics rack may offer significant energy efficiency and higher performance cooling benefits, compared with currently available air or hybrid air and water cooled systems.

As in the above example, in the examples discussed below, the dielectric fluid (i.e., coolant) may comprise any one of a variety of commercially available dielectric coolants. For example, any of the Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 4A:
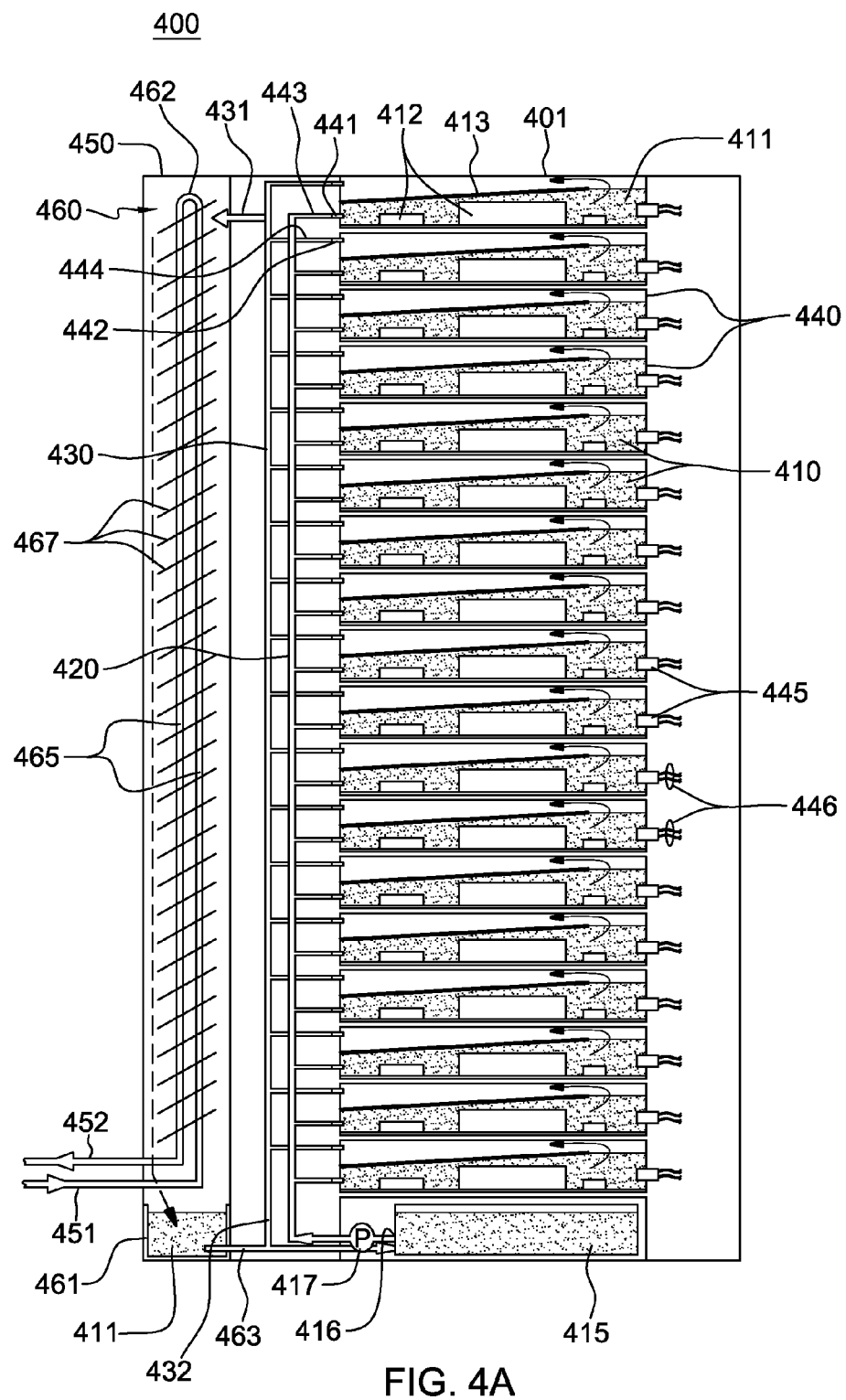
FIG. 4A is an elevational view of one embodiment of a liquid-cooled electronics rack comprising a plurality of horizontally-disposed, immersion-cooled electronic subsystems, in accordance with an aspect of the present invention.

FIG. 4A is a schematic illustration of one embodiment of a liquid-cooled electronics rack, generally denoted 400, employing immersion-cooling of electronic subsystems 410, in accordance with an aspect of the present invention. In this implementation, the plurality of immersion-cooled electronic subsystems 410 are illustrated horizontally-disposed within an electronics rack 401 so as to be essentially stacked within the rack. By way of example, each electronic subsystem 410 may be a server unit of a rack-mounted plurality of server units, and include multiple electronic components to be cooled. In one embodiment, each electronic subsystem comprises multiple different types of electronic components to be cooled having different heights and/or shapes.

Figure 4B:
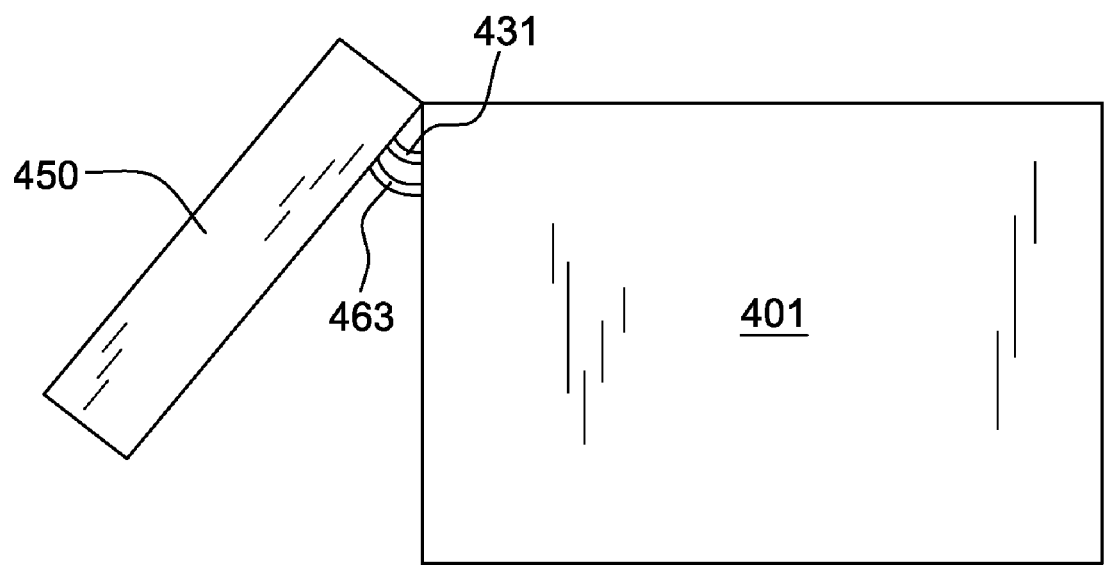
FIG. 4B is a plan view of the liquid-cooled electronics rack of FIG. 4A, showing the door hingedly mounted to the electronics rack rotated partially open, and depicting the flexible dielectric fluid vapor and dielectric fluid return hoses, in accordance with an aspect of the present invention.

Referring collectively to FIGS. 4A & 4B, the immersion-cooled electronic subsystems 410 each comprise (in this example) a housing 440 at least partially surrounding and forming a compartment about the electronic subsystem, with the plurality of electronic components 412 of the electronic subsystem being disposed within the compartment. In one example, electronic components 412 include one or more processors and one or more dual in-line memory module (DIMM) arrays. A dielectric fluid 411 is provided within the compartment, and the plurality of electronic components to be cooled are immersed within dielectric fluid 411. A baffle 413 is provided to facilitate maintaining electronic components 412 immersed within the dielectric fluid, and to direct flow of dielectric fluid vapor generated by boiling of dielectric fluid at one or more surfaces of the electronic components towards a dielectric fluid vapor outlet 442 disposed in an upper portion of the compartment. In one embodiment, baffle 413 includes multiple openings (not shown) which facilitate drainage of any dielectric fluid in liquid state above baffle 413 back to the lower portion of the compartment, and passage of dielectric fluid vapor from the lower portion of the compartment to the upper portion of the compartment. As illustrated, the housing further includes a dielectric fluid inlet 441 through which dielectric fluid in liquid state is provided to the compartment. A dielectric fluid inlet line 443 and a dielectric fluid outlet line 444 couple to the respective dielectric fluid inlet 441 and dielectric fluid vapor outlet 442.

In an operational state, dielectric fluid 411 pools in the liquid state at the bottom of the compartment and is of sufficient volume to submerge the electronic components 412. Electronic components 412 dissipate varying amounts of power, which cause the dielectric fluid to boil, releasing a dielectric fluid vapor, which rises to the upper portion of the compartment of the housing.

One or more hermetically-sealed electrical connectors 445 are also provided in each housing 440, for example, at a back surface thereof, for docking into a corresponding electrical plane of the electronics rack in order to provide electrical and network connections 446 to the electronic subsystem disposed within the housing when the electronic subsystem is operatively positioned within the housing and the housing is operatively positioned within the electronics rack.

As illustrated in FIGS. 4A & 4B, dielectric fluid vapor lines 444 couple in fluid communication dielectric fluid vapor outlets 442 of immersion-cooled electronic subsystems 410 and a dielectric fluid vapor return manifold 430. Dielectric fluid vapor return manifold 430 in turn couples in fluid communication the dielectric fluid vapor lines 444 and a vertically-oriented, vapor-condensing unit 460. This later coupling is via at least one dielectric fluid vapor hose 431. In the embodiment of FIGS. 4A & 4B, one dielectric fluid vapor hose is illustrated (by way of example only). Further, in the embodiment depicted, vertically-oriented, vapor-condensing unit 460 is disposed within a door 450 that is hingedly mounted along one vertical edge thereof to electronics rack 401. As shown in FIG. 4B, dielectric fluid vapor hose 431 is a flexible hose which couples to the vapor-condensing unit within the door adjacent to (or near) a hinge point (or edge) of the door relative to the electronics rack.

As illustrated in FIG. 4A, vertically-oriented, vapor-condensing unit 460 comprises a tube and fin heat exchanger (i.e., vertically-oriented, vapor-condensing heat exchanger 462), which extracts heat from dielectric fluid vapor (and liquid) passing into the vertically-oriented, vapor-condensing unit 460 from dielectric fluid vapor return manifold 430 via the at least one dielectric fluid vapor hose 431. In the embodiment illustrated, one or more vertically-oriented tubes 465 of the heat exchanger are coupled in fluid communication with a facility coolant supply line 451 and a facility coolant return line 452 to allow for passage of cool facility coolant through the vertically-oriented, vapor-condensing heat exchanger 462. A plurality of sloped, thermally conductive fins 467 are, in one embodiment, in physical and/or thermal contact with the plurality of tubes 465. The vertically-oriented, vapor-condensing unit 460 cools dielectric fluid vapor (and liquid) passing into the vertically-oriented, vapor-condensing unit and produces dielectric fluid 411 condensate. This dielectric fluid condensate drops via gravity to the bottom of the vertically-oriented, vapor-condensing unit, into a condensate collector 461 disposed in the bottom of door 450, and is subsequently drained via dielectric fluid return hose 463 to a reservoir 415 in fluid communication therewith.

As illustrated, reservoir 415 is disposed (in one embodiment) in a lower portion of electronics rack 401. Reservoir 415 includes a reservoir outlet 416; and a pump 417 is coupled in fluid communication therewith. Pump 417 supplies dielectric fluid under pressure from reservoir 415 to a dielectric fluid supply manifold 420, which couples in fluid communication reservoir 415 and dielectric fluid inlets 441 of the plurality of immersion-cooled electronic subsystems 410, that is, via respective dielectric fluid supply lines 443. Note that, since principally all heat transfer in the liquid-cooled electronics rack of FIGS. 4A & 4B occurs via boiling and vapor generation, the total coolant volumetric flow rate to be provided by pump 417 is relatively small. Note that dielectric fluid 411 condensate residing in the condensate collector at the bottom of vertically-oriented, vapor-condensing unit 460 is transferred through the dielectric fluid return hose 463 to reservoir 415, and a liquid drain pipe 432 is disposed at a lower end of dielectric fluid vapor return manifold 430 for draining any dielectric fluid condensate from dielectric fluid vapor return manifold 430 to dielectric fluid return hose 463.

Note also that, in operation, facility coolant supplied to vertically-oriented, vapor-condensing heat exchanger 460 needs to be at a temperature below the saturation temperature of the dielectric fluid. By way of example, if the facility coolant is water, a temperature of about 30° C., or higher, may be employed based on the saturation temperature of the dielectric fluid within the liquid-cooled electronics rack. Such a relatively high coolant temperature means that minimum cooling power is required to provide facility coolant at the desired temperature to remove heat from the electronics rack.

In general, fluidic coupling between the electronic subsystems and the dielectric fluid manifolds and lines, as well as between the return manifold and the vapor-condensing unit, and the vapor-condensing unit and reservoir, and the facility coolant supply and return lines and the vapor-condensing heat exchanger, can be established using suitable hoses, hose barb fittings and quick disconnect couplers. In one example, the illustrated, vertically-oriented dielectric fluid vapor return and dielectric fluid supply manifolds each include ports which facilitate fluid connection of the respective components to the manifolds via flexible hoses. Respective quick connect couplings may be employed to couple flexible dielectric fluid inlet and outlet lines 443, 444 to the respective dielectric fluid inlets and vapor outlets of the immersion-cooled electronic subsystems, to (for example) allow for removal of a housing and electronic subsystem from the electronics rack. The quick connect couplings may be any one of various types of commercially available couplings, such as those available from Colder Products Company, of St. Paul, Minn., U.S.A., or Parker Hannifin, of Cleveland, Ohio, U.S.A.

Note also that the fluidic connections between the components within the electronics rack and the vertically-oriented, vapor-condensing unit disposed within the door, that is, the at least one dielectric fluid vapor hose 431 and the dielectric fluid return hose 463, at the top and bottom of the electronics rack, respectively, are flexible enough to allow the door to be readily opened and closed. FIG. 4B schematically illustrates a partially rotated open door 450 relative to the electronics rack. These hoses have sufficient length, or loop, to allow the hoses to rotate and traverse in a manner to allow the door to be opened and closed without requiring a prohibitive amount of force and without compromising the structural integrity of the joints between the hoses and the fittings on the door or the electronics rack.

The vertically-oriented, vapor-condensing unit 460 is a passive vapor-condensing unit. As noted, the unit may comprise facility coolant-carrying tubes and thermally conductive fins extending from the outer surfaces of the tubes. The thermally conductive fins 467 extending from the facility coolant-carrying tubes 465 are illustrated sloping downward to facilitate gravity-assisted drainage of condensate forming on the fin surfaces. If desired, other fin configurations, including, inverted V-shaped configurations, could be employed within the vertically-oriented, vapor-condensing unit.

In one embodiment, door 450 is fabricated of a polymeric material with insulating properties, such as Teflon. Door 450 does not need to be a thermally conductive material. Also, since the immersion-cooled electronic subsystems are completely immersion-cooled, there is no functional need for the door to allow air to flow therethrough, and therefore, the door can be a solid door.

Since heat transfer in the liquid-cooled electronics rack embodiment of FIGS. 4A & 4B occurs using boiling and vapor generation, the total coolant volumetric flow rate required to be provided by the pump is relatively small. In addition, as noted, the facility coolant supplied to the vapor-condensing unit should be at a temperature that is below the saturation temperature of the coolant inside the immersion-cooling subsystems. For example, the facility coolant temperature may be approximately 30° C. or higher, based on the saturation temperature of the dielectric coolant inside the system. Such a relatively high coolant temperature means that minimal cooling power is required to produce the chilled facility coolant required to remove heat from the electronics rack via the vertically-oriented, vapor-condensing unit. The use of a rack door to house the vertically-oriented, vapor-condensing unit means that more of the electronics rack can be used to house immersion-cooled electronic subsystems, or other subsystems or components. In addition, the relatively large volume of the rack door is advantageously utilized in housing a larger vertically-oriented, vapor-condensing unit than what might otherwise be possible if located within the electronics rack.

FIGS. 5A-5E illustrate an alternate embodiment of a liquid-cooled electronics rack 400' employing immersion-cooling of electronic subsystems 410, in accordance with an aspect of the present invention. Liquid-cooled electronics rack 400' is similar to that described above in connection with FIGS. 4A & 4B, with a couple of differences. One difference is the addition of a plurality of dielectric fluid vapor return hoses 500 directly coupling in fluid communication the dielectric fluid vapor outlets 442 of immersion-cooled electronic subsystems 410 and vertically-oriented, vapor-condensing unit 460 disposed within rack door 450. These fluidic couplings can be facilitated via, for example, one or more quick connect couplings 501, such as referenced above. In this implementation, the plurality of dielectric fluid vapor hoses 500 would each need to exhibit similar flexibility as discussed above in connection with the hoses of FIGS. 4A & 4B to allow for opening and closing of door 450 relative to electronics rack 401.

Figure 5A:
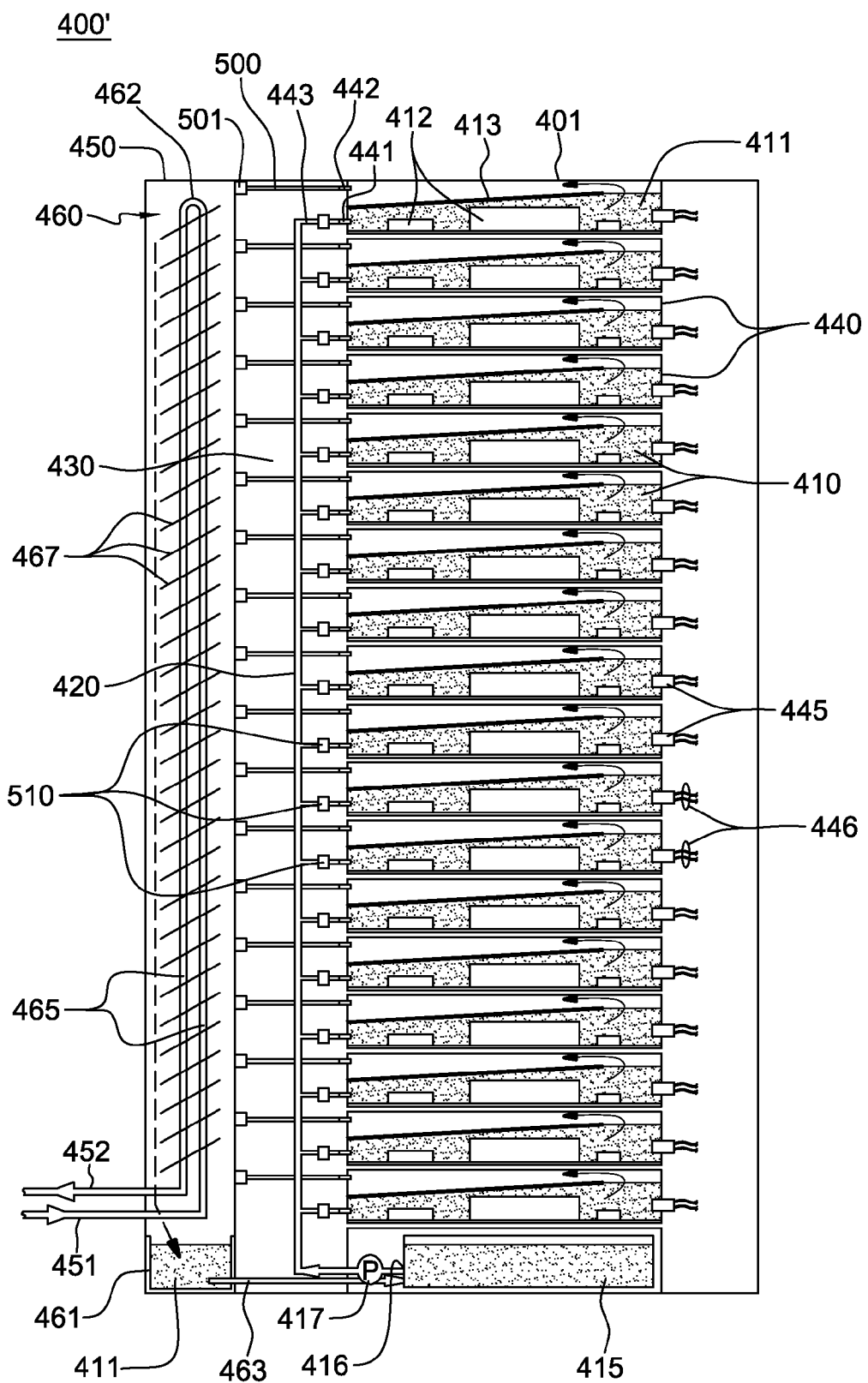
FIG. 5A is an elevational view of another embodiment of a liquid-cooled electronics rack comprising a plurality of horizontally-disposed, immersion-cooled electronic subsystems, in accordance with an aspect of the present invention.
Figure 5B:
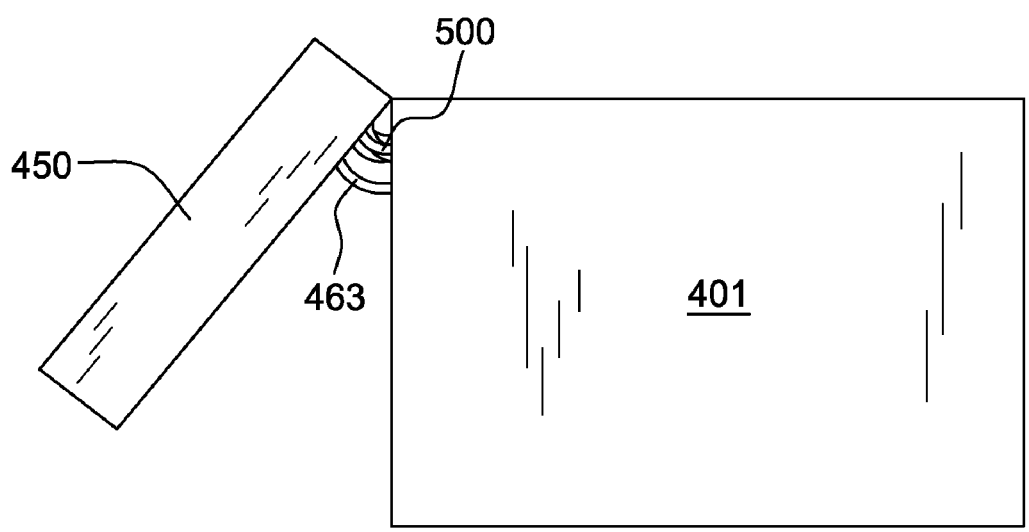
FIG. 5B is a plan view of the liquid-cooled electronics rack of FIG. 4A, showing the door hingedly mounted to the electronics rack rotated partially open, and depicting the flexible dielectric fluid vapor and dielectric fluid return hoses, in accordance with an aspect of the present invention.

FIGS. 5C-5E illustrate in greater detail vertically-oriented, vapor-condensing unit 460 disposed within door 450 of the liquid-cooled electronics rack. Note that, in an alternate embodiment, vertically-oriented, vapor-condensing unit 460 could reside within a vertically-extending housing affixed externally or internally along one or more sides of the electronics rack. Referring to FIGS. 5C-5E collectively, vertically-oriented, vapor-condensing unit 460 is shown to include vertically-oriented, vapor-condensing heat exchanger 462, which comprises a plurality of vertically-extending, facility coolant-carrying tubes 465 connected in fluid communication and having a plurality of sloped, thermally conductive fins 467 extending therefrom. External surfaces of the plurality of sloped, thermally conductive condenser fins 467 and the vertically-extending, facility coolant-carrying tubes 465 function as condenser (or cooling) surfaces upon which dielectric fluid vapor may condense. The vapor-condensing unit is vertically-oriented to take advantage of the height of the electronics rack, without significantly extending the length or width of the rack. Any dielectric fluid condensate forming within the vapor-condensing unit drops via gravity into condensate collector 461 disposed below vertically-oriented, vapor-condensing heat exchanger 462. The plurality of quick connect couplings 501 facilitating fluidic coupling of the dielectric fluid vapor hoses 500 (FIG. 5A) to the vapor-condensing unit are illustrated in FIG. 5E.

Note that, in one aspect, the vertically-oriented, vapor-condensing unit of FIGS. 5C-5E may be configured as a dielectric fluid vapor manifold, which may be positioned, if desired, within the electronics rack itself provided room is available. By providing the vapor-condensing unit within a rack door, however, greater area is provided for the condenser to allow for a larger vertically-oriented, vapor-condensing unit footprint, and thus, enhanced cooling of the dielectric fluid vapor (and liquid) egressing from the immersion-cooled electronic subsystems.

FIG. 5F depicts a variation on the fin structure of FIG. 5D, wherein a plurality of drainage slots 505 are provided within the thermally conductive fins 467 to facilitate drainage of condensate from the fins downwards to condensate collector 461 at the bottom of the vertically-oriented, vapor-condensing unit.

Also shown in the liquid-cooled electronics rack embodiment of FIG. 5A is the inclusion of multiple flow restrictors 510 disposed, in this example, at the dielectric fluid inlets to immersion-cooled electronic subsystems 410. These flow restrictors are configured and positioned to eliminate any maldistribution of dielectric fluid flow through the multiple immersion-cooled electronic subsystems. The flow restrictors provided in the embodiment of FIG. 5A facilitate tailoring of dielectric fluid flow resistance through the immersion-cooled electronic subsystems. These flow restrictors may comprise fixed or adjustable flow restrictors, or both.

Fixed flow restrictors comprise a fixed orifice diameter, and two or more of the fixed orifice diameters of the flow restrictors in the liquid-cooled electronics rack may be differently sized to define different coolant flow resistances through at least two different immersion-cooled electronic subsystems, for example, depending on the electronic subsystems to be cooled and/or the location of the electronic subsystems within the rack relative to, for example, pump 417. By defining different dielectric fluid flow resistances, the multiple flow restrictors tailor the dielectric fluid flow to facilitate overall heat transfer within the plurality of immersion-cooled electronic subsystems by, for example, facilitating maintaining a desired liquid level within each of the electronic subsystems.

In an alternative embodiment, the multiple flow restrictors each may be fixed flow restrictors with fixed orifice diameters of equal size. This would ensure a common dielectric fluid flow into the plurality of immersion-cooled electronic subsystems. This implementation might be advantageous where it is assumed that electronic subsystems within the electronics rack are identical, whereas different flow restrictors with different fixed orifice diameters may be beneficial in an implementation where the electronic subsystems are differently sized and/or powered.

Figure 6A:
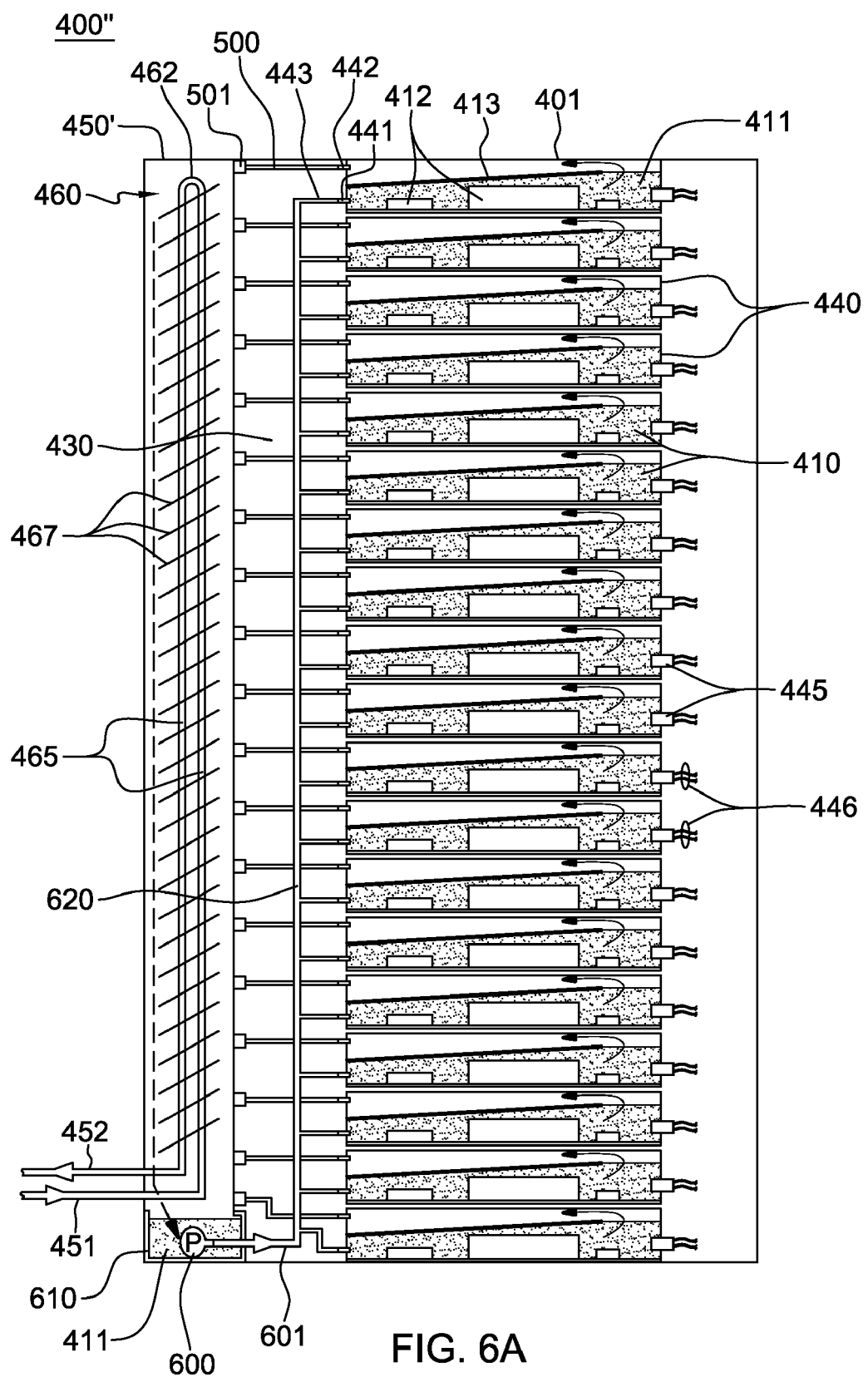
FIG. 6A is an elevational view of another embodiment of a liquid-cooled electronics rack comprising a plurality of horizontally-disposed, immersion-cooled electronic subsystems, in accordance with an aspect of the present invention.

Those skilled in the art should note from the above description, that although depicted with reference to the embodiment of FIG. 5A, the multiple flow restrictors could also, alternatively, be applied in combination with the liquid-cooled electronics rack embodiment of FIGS. 4A & 6A. In addition, although principally described above as fixed flow restrictors, one or more of the multiple flow restrictors could comprise adjustable flow restrictors controlled, for example, with reference to a level of dielectric fluid within the respective immersion-cooled electronic subsystem. Such a configuration would provide an advantage in that each electronic subsystem would be self-monitoring and adjust the dielectric fluid flow resistance therethrough as required to cool the heat load generated by the electronic subsystem. By way of example, various passively controlled, adjustable flow restrictors are provided by Metrix Valve Corp., of Glendora, Calif., U.S.A.

Figure 6B:
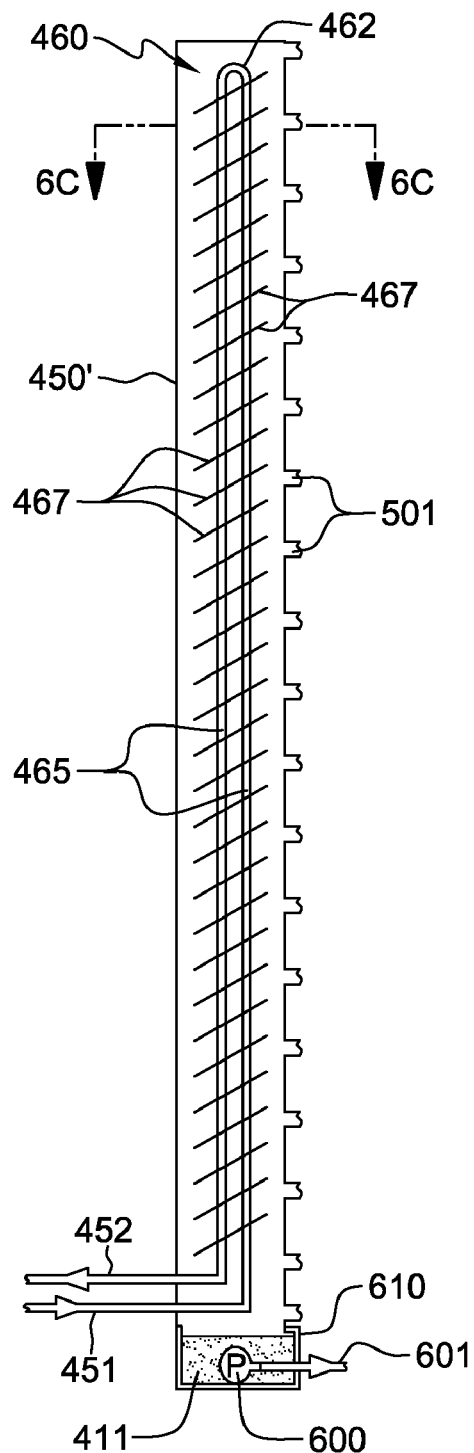
FIG. 6B is a cross-sectional elevational view of the door and vertically-oriented, vapor-condensing unit embodiment of FIG. 6A, taken along line 6B-6B in the cross-sectional plan view thereof of FIG. 6C, in accordance with an aspect of the present invention.
Figure 6C:
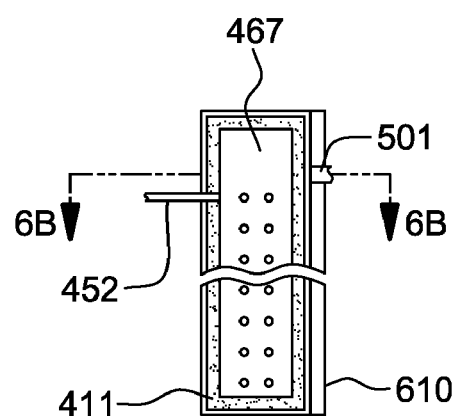
FIG. 6C is a cross-sectional plan view of the door and vertically-oriented, vapor-condensing unit embodiment of FIG. 6B, taken along line 6C-6C thereof, in accordance with an aspect of the present invention.

FIGS. 6A-6C illustrate a further embodiment of a liquid-cooled electronics rack 400", in accordance with an aspect of the present invention. Liquid-cooled electronics rack 400" is similar to that described above in connection with the embodiments of FIGS. 4A & 4B, and 5A-5E.

As illustrated, vertically-oriented, vapor-condensing unit 460 is disposed within a rack door 450' to facilitate condensing of dielectric fluid vapor egressing from the individual immersion-cooled electronic subsystems 410 of electronics rack 401. In this embodiment, the reservoir and pump are positioned within rack door 450', for example, to provide additional room within electronics rack 401 for one or more further immersion-cooled electronic subsystems, or other subsystems or components to be included within the rack unit. To accomplish this, the rack door is enlarged to include a reservoir 610, which directly collects dielectric fluid 411 condensate draining from vertically-oriented, vapor-condensing unit 460. Note that the enlarging of a lower portion of the rack door assumes that there is sufficient space on the opposing structures of the electronics rack to accommodate the enlarged lower portion of the door containing reservoir 610. A dielectric fluid supply hose 601 couples in fluid communication a submerged pump 600 within reservoir 610 and a dielectric fluid supply manifold 620 disposed within electronics rack 401. Dielectric fluid supply hose 601 is similar to the flexible hoses described above in connection with the door-mounted, vapor-condensing unit embodiments of FIGS. 4A & 5A.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A liquid-cooled electronics rack comprising:
an electronics rack, the electronics rack comprising a plurality of immersion-cooled electronic subsystems, each immersion-cooled electronic subsystem comprising:
 a housing at least partially surrounding and forming a compartment about the electronic subsystem, the electronic subsystem comprising a plurality of electronic components to be cooled;
 a dielectric fluid disposed within the compartment, wherein the plurality of electronic components to be cooled are at least partially immersed within the dielectric fluid; and
 a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet;

a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent to at least one side of the electronics rack;

a reservoir for holding dielectric fluid, the reservoir receiving dielectric fluid condensate from the vertically-oriented, vapor-condensing unit;

a dielectric fluid supply manifold coupling in fluid communication the reservoir and the dielectric fluid inlets of the plurality of immersion-cooled electronic subsystems;

a pump associated with the reservoir for pumping under pressure dielectric fluid from the reservoir to the dielectric fluid supply manifold for maintaining dielectric fluid in a liquid state within the compartments of the plurality of immersion-cooled electronic subsystems; and a vertically-oriented, vapor-condensing heat exchanuer disposed within the vertically-oriented, vapor-condensing, unit, and a facility coolant supply line and a facility coolant return line coupled in fluid communication with the vertically-oriented, vapor-condensing heat exchanger for passing chilled facility coolant therethrough, the chilled faclity coolant being at a temperature below a saturation temperature of the dielectric fluid vapor egressing from the compartments of the plurality of immersion-cooled electronic subsystems.

2. The liquid-cooled electronics rack of claim 1, wherein the vertically-oriented, vapor-condensing unit is disposed within a door mounted to the electronics rack, and wherein the liquid-cooled electronics rack further comprises at least one dielectric fluid vapor hose facilitating coupling in fluid communication the dielectric fluid vapor outlets of the plurality of immersion-cooled electronic subsystems and the vertically-oriented, vapor- condensing unit disposed within the door, each dielectric fluid vapor hose of the at least one dielectric fluid vapor hose being a flexible hose coupled to the door adjacent to a hinge point of the door relative to the electronics rack.

3. The liquid-cooled electronics rack of claim 1, wherein the vertically-oriented, vapor-condensing unit is disposed with a door mounted to the electronics rack, and wherein the liquid-cooled electronics rack further comprises a dielectric fluid vapor return manifold coupled in fluid communication with the dielectric fluid vapor outlets of the plurality of immersion-cooled electronic subsystems and the at least one dielectric fluid vapor hose, the dielectric fluid vapor return manifold being disposed within the electronics rack, and coupled in fluid communication with the vertically-oriented, vapor-condensing unit disposed within the door via the at least one dielectric fluid vapor hose.

4. The liquid-cooled electronics rack of claim 3, farther comprising a dielectric fluid return hose coupling in fluid communication a lower portion of the vertically-oriented, vapor-condensing unit in the door and the reservoir, wherein the reservoir is disposed within the electronics rack, the lower portion of the vertically-oriented, vapor-condensing unit collecting dielectric fluid condensate from the vertically-oriented, vapor-condensing heat exchanger for transfer via the dielectric fluid return hose to the reservoir.

5. The liquid-cooled electronics rack of claim 3, further comprising a plurality of dielectric fluid vapor hoses coupling in fluid communication the dielectric fluid vapor outlets of the plurality of immersion-cooled electronic subsystems and the vertically-oriented, vapor-condensing unit disposed within the door, each dielectric fluid vapor hose being a flexible hose coupling in fluid communication a respective dielectric fluid vapor outlet of an immersion-cooled electronic subsystem of the plurality of immersion-cooled electronic subsystems and the vertically-oriented, vapor-condensing unit and each dielectric fluid vapor hose being disposed adjacent to a hinge point of the door relative to the electronics rack.

6. The liquid-cooled electronics rack of claim 5, wherein the reservoir is disposed within the vertically-oriented, vapor-condensing unit below the vertically-oriented, vapor-condensing heat exchanger, and wherein the pump is a submerged pump within the reservoir.

7. The liquid-cooled electronics rack of claim 1, wherein the plurality of immersion-cooled electronic subsystems are horizontally-disposed within the electronics rack, each with the plurality of electronic components thereof being positioned in a lower portion of the compartment and immersed within the dielectric fluid, and wherein at least one immersion-cooled electronic subsystem of the plurality of immersion-cooled electronic subsystems further comprises a baffle disposed within the compartment to facilitate immersion cooling of the electronic components thereof and to facilitate directing dielectric fluid vapor within the compartment towards the dielectric fluid vapor outlet of the compartment.

8. A liquid-cooled electronics rack comprising:
an electronics rack, the electronics rack comprising a plurality of immersion-cooled electronic subsystems, each immersion-cooled electronic subsystem comprising:
a housing at least partially surrounding and forming a compartment about the electronic subsystem, the electronic subsystem comprising a plurality of electronic components to be cooled;
a dielectric fluid disposed within the compartment, wherein the plurality of electronic components to be cooled are at least partially immersed within the dielectric fluid; and
a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet;

a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent to at least one side of the electronics rack;

a reservoir for holding dielectric fluid, the reservoir receiving dielectric fluid condensate from the vertically-oriented, vapor-condensing unit;

a dielectric fluid supply manifold coupling in fluid communication the reservoir and the dielectric fluid inlets of the plurality of immersion-cooled electronic subsystems;

a pump associated with the reservoir for pumping under pressure dielectric fluid from the reservoir to the dielectric fluid supply manifold for maintaining dielectric fluid in a liquid state within the compartments of the plurality of immersion-cooled electronic subsystems;

multiple flow restrictors associated with multiple immersion-cooled electronic subsystems of the plurality of immersion-cooled electronic subsystems, each flow restrictor of the multiple flow restrictors being associated with a respective immersion-cooled electronic subsystem of the multiple immersion-cooled electronic subsystems and being disposed in fluid communication with the dielectric fluid inlet to the compartment thereof, and wherein the multiple flow restrictors facilitate balancing dielectric fluid flow from the dielectric fluid supply manifold to the multiple immersion-cooled electronic subsystems of the liquid-cooled electronics rack; and a vertically-oriented, vapor-condensing heat exchanger disposed within the Vertically-oriented, vapor-condensing unit, and a facility coolant supply line and a facility coolant return line coupled in fluid communication with the vertically-oriented, vapor-condensing heat exchanger for passing chilled facility coolant therethrowth, the chilled facility coolant being at a temperature below a saturation temperature of the dielectric fluid vapor ezressing from the compartments of the plurality of immersion-cooled electronic subsystems.

9. The liquid-cooled electronics rack of claim 8, wherein the multiple flow restrictors facilitate defining different dielectric fluid flow resistances through at least two immersion-cooled electronic subsystems of the multiple immersion-cooled electronic subsystems.

10. The liquid-cooled electronics rack of claim 8, wherein the vertically-oriented, vapor-condensing unit is disposed within a door mounted to the electronics rack, and wherein the liquid-cooled electronics rack further comprises at least one dielectric fluid vapor hose facilitating coupling in fluid communication the dielectric fluid vapor outlets of the plurality of immersion-cooled electronic subsystems and the vertically-oriented, vapor-condensing unit disposed within the door, each dielectric fluid vapor hose of the at least one dielectric fluid vapor hose being a flexible hose coupled to the door adjacent to a hinge point of the door relative to the electronics rack.

11. The liquid-cooled electronics rack of claim 8, wherein the vertically-oriented, vapor-condensing unit is disposed with a door mounted to the electronics rack, and wherein the liquid-cooled electronics rack further comprises a dielectric fluid vapor return manifold coupled in fluid communication with the dielectric fluid vapor outlets of the plurality of immersion-cooled electronic subsystems and the at least one dielectric fluid vapor hose, the dielectric fluid vapor return manifold being disposed within the electronics rack, and coupled in fluid communication with the vertically-oriented, vapor-condensing unit disposed within the door via the at least one dielectric fluid vapor hose.

12. The liquid-cooled electronics rack of claim 11, further comprising a dielectric fluid return hose coupling in fluid communication a lower portion of the vertically-oriented, vapor-condensing unit in the door and the reservoir, wherein the reservoir is disposed within the electronics rack, the lower portion of the vertically-oriented, vapor-condensing unit collecting dielectric fluid condensate from the vertically-oriented, vapor-condensing heat exchanger for transfer via the dielectric fluid return hose to the reservoir.

13. The liquid-cooled electronics rack of claim 11, further compriSing a plurality of dielectric fluid vapor hoses coupling in fluid communication the dielectric fluid vapor outlets of the plurality of immersion-cooled electronic subsystems and the vertically-oriented, vapor-condensing unit disposed within the door, each dielectric fluid vapor hose being a flexible hose coupling in fluid communication a respective dielectric fluid vapor outlet of an immersion-cooled electronic subsystem of the plurality of immersion-cooled electronic subsystems and the vertically-oriented, vapor-condensing unit and each dielectric fluid vapor hose being disposed adjacent to a hinge point of the door relative to the electronics rack.

14. The liquid-cooled electronics rack of claim 13, wherein the reservoir is disposed within the vertically-oriented, vapor-condensing unit below the vertically-oriented, vapor-condensing heat exchanger, and wherein the pump is a submerged pump within the reservoir.

15. A method of facilitating liquid cooling of an electronics rack, the method comprising:

providing the electronics rack with a plurality of immersion-cooled electronic subsystems, each immersion-cooled electronic subsystem comprising:
  a housing at least partially surrounding and forming a compartment about the electronic subsystem, the electronic subsystem comprising a plurality of electronic components to be cooled;
  a dielectric fluid disposed within the compartment, wherein the plurality of electronic components to he cooled are at least partially immersed within the dielectric fluid; and
  a dielectric fluid inlet and a dielectric fluid vapor outlet in fluid communication with the compartment, wherein dielectric fluid is provided to the compartment via the dielectric fluid inlet and dielectric fluid vapor egresses from the compartment via the dielectric fluid vapor outlet;

proViding a vertically-oriented, vapor-condensing unit facilitating condensing of dielectric fluid vapor egressing from the compartments of the plurality of immersion-cooled electronic subsystems, wherein the dielectric fluid vapor outlets of the plurality of immersion-cooled electronic subsystems are coupled in fluid communication with the vertically-oriented, vapor-condensing unit, and the vertically-oriented, vapor-condensing unit is sized and configured to reside adjacent to at least one side of the electronics rack;

providing a reservoir for holding dielectric fluid, the reservoir receiving dielectric fluid condensate from the vertically-oriented, vapor-condensing unit;

providing a dielectric fluid supply manifold coupling in fluid communication the reservoir and the dielectric fluid inlets of the plurality of immersion-cooled electronic subsystems;

providing a pump associated with the reservoir for pumping under pressure dielectric fluid from the reservoir to the dielectric fluid supply manifold for maintaining dielectric fluid in a liquid state within the compartments of the plurality of immersion-cooled electronic subsystems; and wherein providing, the vertically-oriented vapor-condensing unit comprises providing a vertically-oriented, vapor-condensing heat exchanger disposed within the vertically-oriented, vapor-condensing unit, and the method further comprises providing a facility coolant supply line and a facility coolant return line coupled in fluid communication with the vertically-oriented, vapor-condensing, heat exchanger for passing chilled facility coolant therethrough, the chilled facility coolant being at a temperature below a saturation temperature of the dielectric fluid vapor egressing from the compartments of the plurality of immersion-cooled electronic subsystems.

16. The method of claim 15, wherein providing the vertically-oriented, vapor-condensing unit comprising disposing the vertically-oriented, vapor-condensing unit within a door mounted to the electronics rack, and wherein the method further comprises providing at least one dielectric fluid vapor hose facilitating coupling in fluid communication the dielectric fluid vapor outlets of the plurality of immersion-cooled electronic subsystems and the vertically-oriented, vapor-condensing unit disposed within the door, each dielectric fluid vapor hose of the at least one dielectric fluid vapor hose being a flexible hose coupled to the door adjacent to a hinge point of the door relative to the electronics rack.

17. The method of claim 15, wherein providing the vertically-oriented, vapor-condensing unit further comprises disposing the vertically-oriented, vapor-condensing unit within a door mounted to the electronics rack, and the method further comprises providing a dielectric fluid vapor return manifold coupled in fluid communication with the dielectric fluid vapor outlets of the plurality of immersion-cooled electronic subsystems and the at least one dielectric fluid vapor hose, the dielectric fluid vapor return manifold being disposed within the electronics rack, and coupled in fluid communication with the vertically-oriented, vapor-condensing unit disposed within the door via the at least one dielectric fluid vapor hose.

* * * * *